US012777732B2

(12) United States Patent
Kang et al.

(10) Patent No.: US 12,777,732 B2
(45) Date of Patent: Oct. 27, 2026

(54) IMAGE SENSOR

(71) Applicant: SAMSUNG ELECTRONICS CO., LTD., Suwon-si (KR)

(72) Inventors: Jeongsoon Kang, Gumi-si (KR); Minkwan Kim, Hwaseong-si (KR); Minho Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 638 days.

(21) Appl. No.: 17/730,739

(22) Filed: Apr. 27, 2022

(65) Prior Publication Data

US 2023/0040060 A1 Feb. 9, 2023

(30) Foreign Application Priority Data

Aug. 4, 2021 (KR) ........................ 10-2021-0102395

(51) Int. Cl.
*H10F 39/00* (2025.01)
*H10F 39/18* (2025.01)

(52) U.S. Cl.
CPC ....... *H10F 39/8063* (2025.01); *H10F 39/024* (2025.01); *H10F 39/182* (2025.01); *H10F 39/8053* (2025.01); *H10F 39/807* (2025.01)

(58) Field of Classification Search
CPC ......... H01L 27/14627; H01L 27/14685; H01L 27/14621; H01L 27/1463; H01L 27/14645; H01L 27/14603; G02B 5/201
See application file for complete search history.

(56) References Cited

U.S. PATENT DOCUMENTS 7,723,765 B2 5/2010 Park
8,446,498 B2 5/2013 Ishiwata
(Continued)

FOREIGN PATENT DOCUMENTS

JP 2004-32675 A 1/2004
JP 2013-21168 A 1/2013
(Continued)

OTHER PUBLICATIONS

Gallegos J, Stokkermans TJ. Lensmaker's Equation. Jul. 8, 2023. In: StatPearls [Internet]. Treasure Island (FL): StatPearls Publishing; Jan. 2024 PMID: 37603669. (Year: 2024).*
(Continued)

*Primary Examiner* — Marlon T Fletcher
*Assistant Examiner* — Sesha Sairaman Srinivasan
(74) *Attorney, Agent, or Firm* — Sughrue Mion, PLLC

(57) ABSTRACT

Provided is an image sensor including: a substrate including a first pixel domain and a second pixel domain that are adjacent to each other in a first direction, the first pixel domain including first pixels and the second pixel domain including second pixels; a first color filter provided on a first surface of the substrate and vertically overlapping the first pixels; a first microlens provided on the first color filter and each of the first pixels; and a second microlens provided on the first surface of the substrate and vertically overlapping at least a portion of each of the second pixels, wherein a second refractive index of the second microlens is greater than a first refractive index of the first microlens, and wherein a level difference between an uppermost part of the first microlens and an uppermost part of the second microlens is within about 2% of a maximum height of the first microlens.

17 Claims, 17 Drawing Sheets

(56) References Cited

U.S. PATENT DOCUMENTS

| | | | | |
|---|---|---|---|---|
| 10,002,899 | B2 | 6/2018 | Chou et al. | |
| 10,074,682 | B2 | 9/2018 | Toda | |
| 10,341,595 | B2 | 7/2019 | Jung et al. | |
| 10,498,947 | B2 | 12/2019 | Cheng et al. | |
| 10,687,008 | B2 | 6/2020 | Nakata | |
| 2006/0193054 | A1* | 8/2006 | Chang | G02B 3/00 359/626 |
| 2007/0153104 | A1* | 7/2007 | Ellis-Monaghan | H04N 25/133 348/E9.01 |
| 2013/0015545 | A1* | 1/2013 | Toumiya | H10F 39/8063 257/E31.127 |
| 2013/0083214 | A1* | 4/2013 | Nakata | H04N 23/57 257/E31.127 |
| 2013/0222553 | A1* | 8/2013 | Tsuchita | H04N 13/286 348/49 |
| 2014/0375852 | A1 | 12/2014 | Ogino | |
| 2015/0098007 | A1* | 4/2015 | Harasawa | H10F 39/8057 438/69 |
| 2017/0171470 | A1* | 6/2017 | Sakioka | H04N 25/134 |
| 2018/0026065 | A1 | 1/2018 | Hseieh et al. | |
| 2019/0132506 | A1* | 5/2019 | Cheng | H04N 25/703 |
| 2019/0281240 | A1* | 9/2019 | Jung | H04N 25/702 |
| 2020/0083268 | A1* | 3/2020 | Kim | H10K 39/32 |
| 2020/0243579 | A1* | 7/2020 | Pyo | H10F 39/813 |
| 2020/0258928 | A1* | 8/2020 | Seo | H10F 39/8053 |
| 2020/0359002 | A1 | 11/2020 | Yamazaki | |
| 2021/0066356 | A1* | 3/2021 | Sugizaki | G02B 5/20 |
| 2021/0175270 | A1 | 6/2021 | Pang et al. | |

FOREIGN PATENT DOCUMENTS

| | | | | |
|---|---|---|---|---|
| JP | 2016-1682 | A | 1/2016 | |
| JP | 2018-14476 | A | 1/2018 | |
| KR | 10-2013-0125044 | A | 11/2013 | |
| KR | 10-2019-0017197 | A | 2/2019 | |
| KR | 10-2019-0049459 | A | 5/2019 | |
| WO | 2016/098640 | A1 | 6/2016 | |
| WO | WO-2021124964 | A1 * | 6/2021 | H01L 27/14605 |

OTHER PUBLICATIONS

Matthew Parry-Hill, Robert T. Sutter and Michael W. Davidson—National High Magnetic Field Laboratory, Radius and Refractive Index Effects on Lens Action https://www.olympus-lifescience.com/en/microscope-resource/primer/java/lenses/lensvariations/ (Year: 2024).*

Jillian Gallegos et al., Lensmaker's Equation—[Updated Jul. 8, 2023]. In: StatPearls [Internet]. Treasure Island (FL): StatPearls Publishing; Jan. 2024. Available from: https://www.ncbi.nlm.nih.gov/books/NBK594278/). (Year: 2023).*

T. Okawa et al., "A 1/2inch 48M ALL PDAF CMOS Image Sensor Using 0.8μm Quad Bayer Coding 2×20CL with 1.0lux Minimum AF Illuminance Level", 2019, 2019 IEEE International Electron Devices Meeting (IEDM), 4 pages total.

* cited by examiner

IMAGE SENSOR

CROSS-REFERENCE TO RELATED APPLICATION

This application claims priority under 35 U.S.C § 119 to Korean Patent Application No. 10-2021-0102395 filed on Aug. 4, 2021 in the Korean Intellectual Property Office, the disclosure of which is incorporated by reference herein in its entirety.

BACKGROUND

The present disclosure relates to an image sensor, and more particularly, to a microlens of an image sensor and a method of forming the same.

An image sensor converts optical images into electrical signals. An image sensor can be classified into a charge coupled device (CCD) type and a complementary metal oxide semiconductor (CMOS) type. A CMOS type image sensor or CMOS image sensor (CIS) may include a plurality of two-dimensionally arranged pixels. Each of the pixels includes a photodiode. The photodiode serves to convert incident light into electrical signals.

SUMMARY

One or more example embodiments provide an image sensor having improved optical properties.

According to an aspect of an example embodiment, there is provided an image sensor including: a substrate including a first pixel domain and a second pixel domain that are adjacent to each other in a first direction, the first pixel domain including first pixels and the second pixel domain including second pixels; a first color filter provided on a first surface of the substrate and vertically overlapping the first pixels; a first microlens provided on the first color filter and each of the first pixels; and a second microlens provided on the first surface of the substrate and vertically overlapping at least a portion of each of the second pixels, wherein a second refractive index of the second microlens is greater than a first refractive index of the first microlens, and wherein a level difference between an uppermost part of the first microlens and an uppermost part of the second microlens is within about 2% of a maximum height of the first microlens.

According to an aspect of an example embodiment, there is provided an image sensor including: a substrate including a first pixel domain and a second pixel domain that are adjacent to each other in a first direction, the substrate having a first surface and a second surface that are opposite to each other, the first pixel domain including first pixels, and the second pixel domain including second pixels; a first color filter provided on the first surface of the substrate and vertically overlapping the first pixel domain; first microlenses provided on the first color filter and the first pixels of the first pixel domain; and a second microlens provided on the first surface of the substrate and vertically overlapping at least a portion of each of the second pixels of the second pixel domain, wherein a second width of the second microlens is greater than a first width of each of the first microlenses, and a second refractive index of the second microlens is greater than a first refractive index of each of the first microlenses, wherein the second microlens includes a lens part having a curved top surface; and a flat part between the lens part and the first surface of the substrate, and wherein a bottom surface of the flat part is substantially coplanar with a bottom surface of the first color filter.

According to an aspect of an example embodiment, there is provided an image sensor including: a substrate having a first surface and a second surface that are opposite to each other, the substrate including a first pixel domain and a second pixel domain that are adjacent to each other in a first direction, the first pixel domain including first pixels and the second pixel domain including second pixels; a pixel separation pattern provided in the substrate and separating the first pixels and the second pixels; a photoelectric conversion region in each of the first pixel domain and the second pixel domain; an impurity region and a floating diffusion region that are in each of the first pixel domain and the second pixel domain, and are adjacent to the first surface of the substrate; a device isolation pattern provided on one side of one of the impurity region and the floating diffusion region, the pixel separation pattern penetrating the device isolation pattern; a gate electrode provided on the first surface of the substrate; a gate dielectric pattern provided between the gate electrode and the substrate; a gate spacer provided on a sidewall of the gate electrode; a wiring layer provided on the second surface of the substrate, the wiring layer including a dielectric layer and wiring lines in the dielectric layer; a backside dielectric layer on the second surface of the substrate; a first color filter provided on the backside dielectric layer and vertically overlapping the first pixel domain; a first microlens provided on the first color filter and being on each of the first pixels; a second microlens provided on the backside dielectric layer and vertically overlapping at least a portion of each of the second pixels, wherein a second refractive index of the second microlens is greater than a first refractive index of the first microlens, and wherein a level difference between an uppermost part of the first microlens and an uppermost part of the second microlens is within about 2% of a maximum height of the first microlens.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Figure 1:
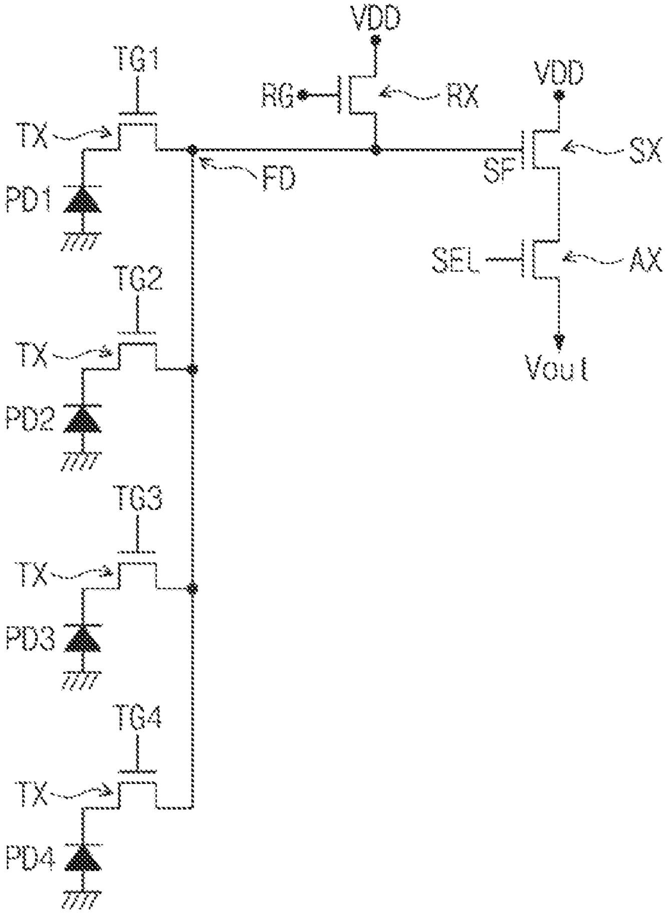
FIG. 1 illustrates a circuit diagram showing an image sensor according to example embodiments.

FIG. 1 illustrates a circuit diagram showing an image sensor according to example embodiments.

Referring to FIG. 1, unit pixels of an image sensor may include photodiodes PD1, PD2, PD3, and PD4, transfer transistors TX, a source follower transistor SX, a reset transistor RX, and a selection transistor AX. The transfer transistors TX, the source follower transistor SX, the reset transistor RX, and the selection transistor AX may respectively include transfer gates TG1, TG2, TG3, and TG4, a source follower gate SF, a reset gate RG, and a selection gate SEL.

Each of the photodiodes PD1, PD2, PD3, and PD4 may be a photodiode including an n-type impurity region and a p-type impurity region. A floating diffusion region FD may serve as a drain of the transfer transistor TX. The floating diffusion region FD may serve as a source of the reset transistor RX. The floating diffusion region FD may be electrically connected to the reset gate RG. The source follower transistor SX may be connected to the selection transistor AX.

An operation of the image sensor will be explained below with reference to FIG. 1. First, a power voltage VDD may be applied to a drain of the reset transistor RX and a drain of the source follower transistor SX under a light-blocked state, such that the reset transistor RX may be turned on to discharge charges that remain on the floating diffusion region FD. Thereafter, when the reset transistor RX is turned off and external light is incident on the photodiodes PD1, PD2, PD3, and PD4, electron-hole pairs may be generated from the photodiodes PD1, PD2, PD3, and PD4. Holes may be transferred to and accumulated on p-type impurity regions of the photodiodes PD1, PD2, PD3, and PD4, and electrons may be transferred to and accumulated on n-type impurity regions of the photodiodes PD1, PD2, PD3, and PD4. When the transfer transistors TX are turned on, charges such as electrons and holes may be transferred to and accumulated on the floating diffusion region FD. A gate bias of the source follower transistor SX may change in proportion to an amount of the accumulated charges, and this may bring about a variation in source potential of the source follower transistor SX. In this case, when the selection transistor AX is turned on, charges may be read out as signals transmitted through a column line.

A wiring line may be electrically connected to at least one selected from the transfer gates TG1 to TG4, the source follower gate SF, the reset gate RG, and the selection gate SEL. The wiring line may be configured to apply the power voltage VDD to the drain of the reset transistor RX or the drain of the source follower transistor SX. The wiring line may include a column line connected to the selection transistor AX. The wiring line will be discussed below.

As an example, FIG. 1 illustrates a structure in which the photodiodes PD1, PD2, PD3, and PD4 are connected to one floating diffusion region FD, but embodiments are not limited thereto. For example, a single unit pixel may include one of the photodiodes PD1, PD2, PD3, and PD4, the floating diffusion region FD, one of the transfer transistors TX, the reset transistor RX, the source follower transistor SX, and the selection transistor AX. Neighboring unit pixels may share at least one selected from the reset transistor RX, the source follower transistor SX, and the selection transistor AX. Therefore, the image sensor may increase in integration.

Figure 2:
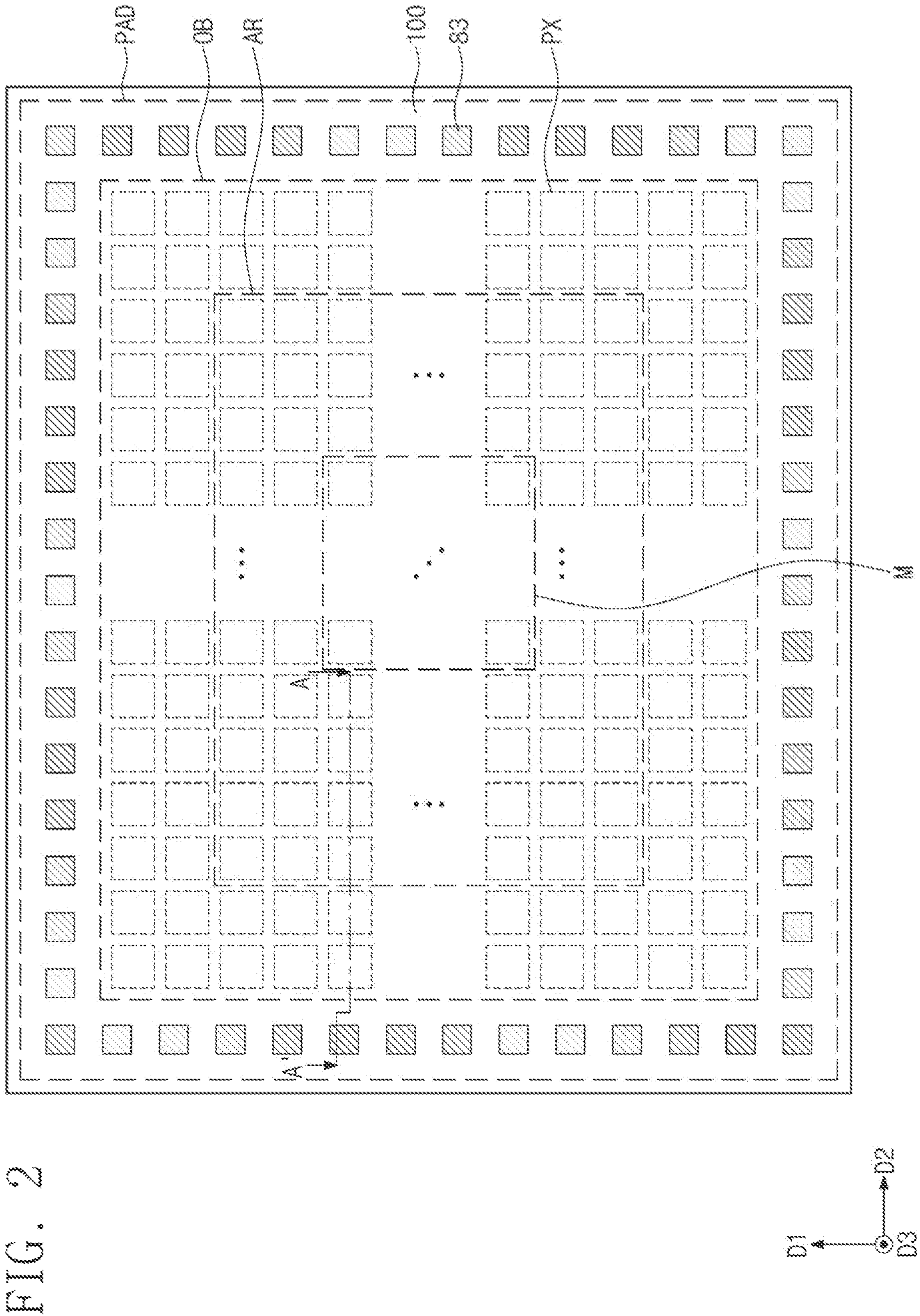
FIG. 2 illustrates a plan view showing an image sensor according to example embodiments.
Figure 3:
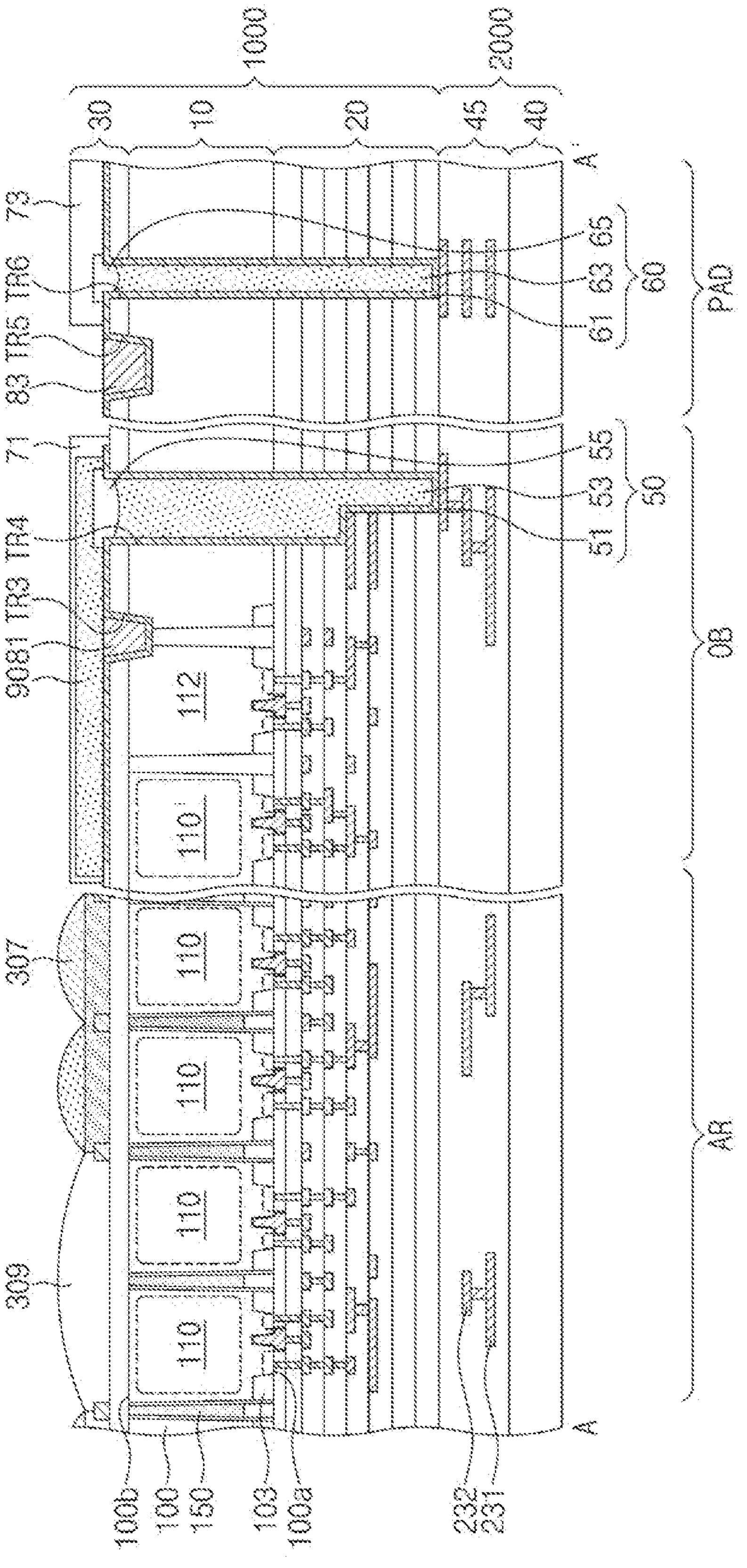
FIG. 3 illustrates a cross-sectional view taken along line A-A' of FIG. 2.

FIG. 2 illustrates a plan view showing an image sensor according to example embodiments. FIG. 3 illustrates a cross-sectional view taken along line A-A' of FIG. 2.

Referring to FIGS. 2 and 3, an image sensor may include a sensor chip 1000 and a circuit chip 2000. The sensor chip 1000 may include a photoelectric conversion layer 10, a first wiring layer 20, and an optical transmission layer 30. The photoelectric conversion layer 10 may include a first substrate 100, a pixel separation pattern 150, a device isolation pattern 103, and photoelectric conversion regions 110 provided in the first substrate 100. The photoelectric conversion regions 110 may convert externally incident light into electrical signals.

Referring to FIG. 2, when viewed in a plan view, the first substrate 100 may include a pixel array area AR, an optical black area OB, and a pad area PAD. When viewed in a plan view, the pixel array area AR may be disposed on a central portion of the first substrate 100. The pixel array area AR may include a plurality of unit pixels PX. The unit pixels PX may output photoelectric signals converted from incident light. The unit pixels PX may be two-dimensionally arranged in columns and rows. The columns may be parallel to a first direction D1. The rows may be parallel to a second direction D2. The first direction D1 may be parallel to a first surface 100*a* of the first substrate 100. The second direction D2 may be parallel to the first surface 100*a* of the first substrate 100 and may intersect the first direction D1. A third direction D3 may be substantially perpendicular to the first surface 100*a* of the first substrate 100.

The pad area PAD may be provided on an edge portion of the first substrate 100, and when viewed in a plan view, may surround the pixel array area AR. The pad area PAD may include second pad terminals 83. The second pad terminals 83 may externally output electrical signals generated from the unit pixels PX. According to another example embodiment, external electrical signals or voltages may be transferred through the second pad terminals 83 to the unit pixels PX. As the pad area PAD is disposed on the edge portion of the first substrate 100, the second pad terminals 83 may be more easily coupled to outside.

The optical black area OB may be disposed between the pixel array area AR and the pad area PAD of the first substrate 100. When viewed in a plan view, the optical black area OB may be provided adjacent to and surround the pixel array area AR. The optical black area OB may include a plurality of dummy regions 112. The dummy region 112 may generate signals that are used as information to remove subsequent process noise. The pixel array area AR of the image sensor will be further discussed below in detail with reference to FIGS. 4, 5A, and 5B.

Figure 4:
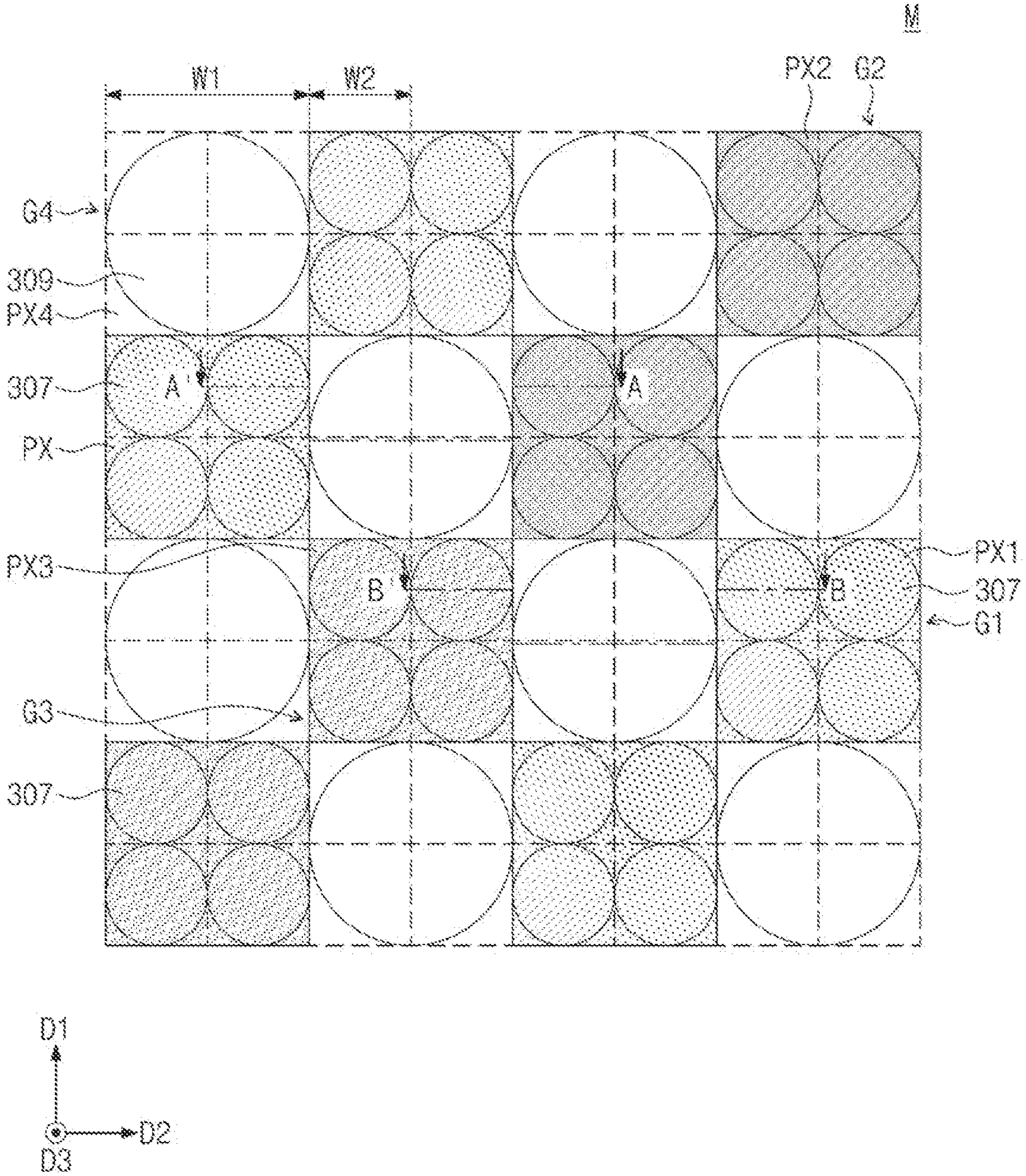
FIG. 4 illustrates an enlarged plan view showing section M of FIG. 2.
Figure 5A:
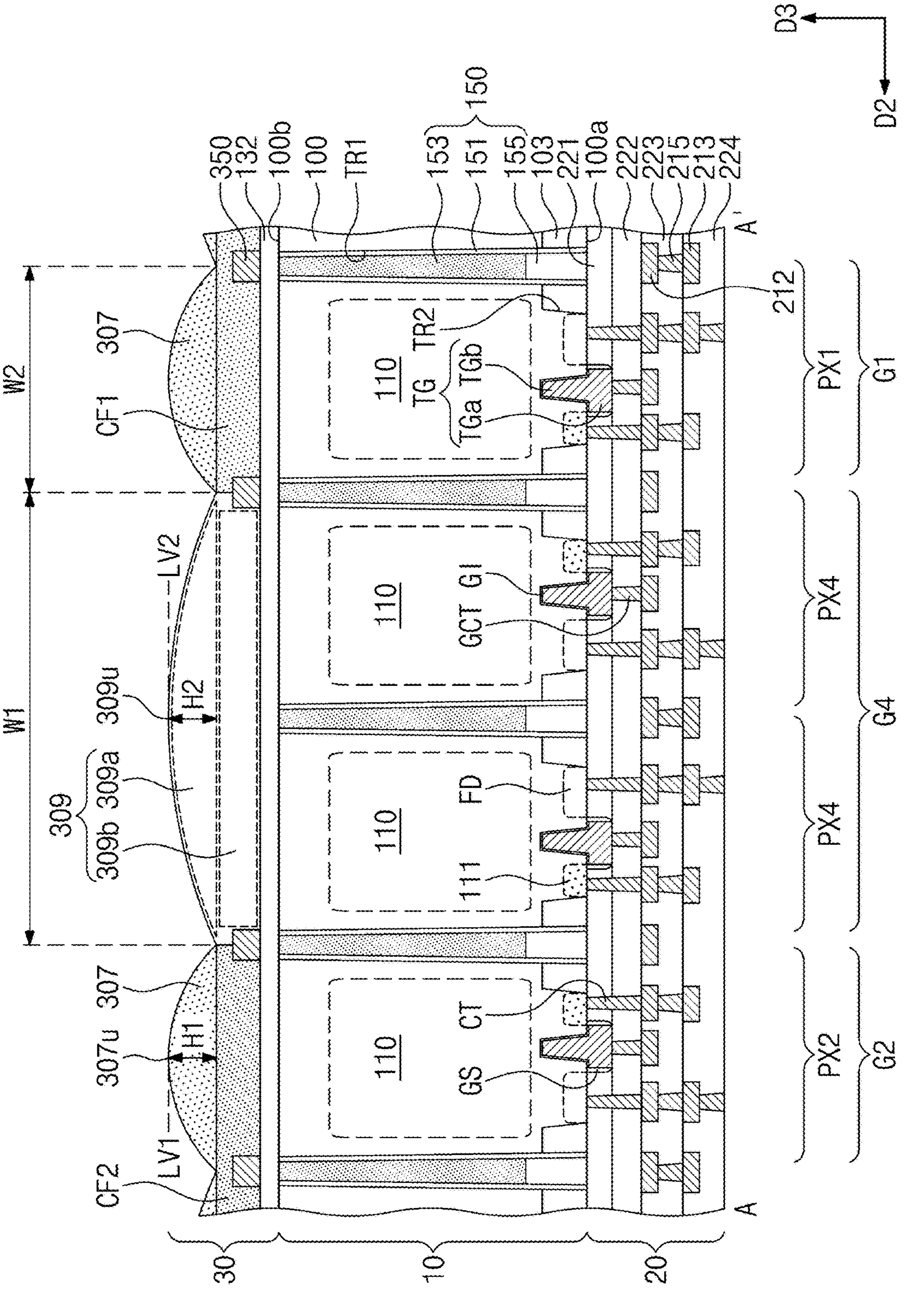
FIGS. 5A and 5B illustrate cross-sectional views respectively taken along lines A-A' and B-B' of FIG. 4.
Figure 5B:
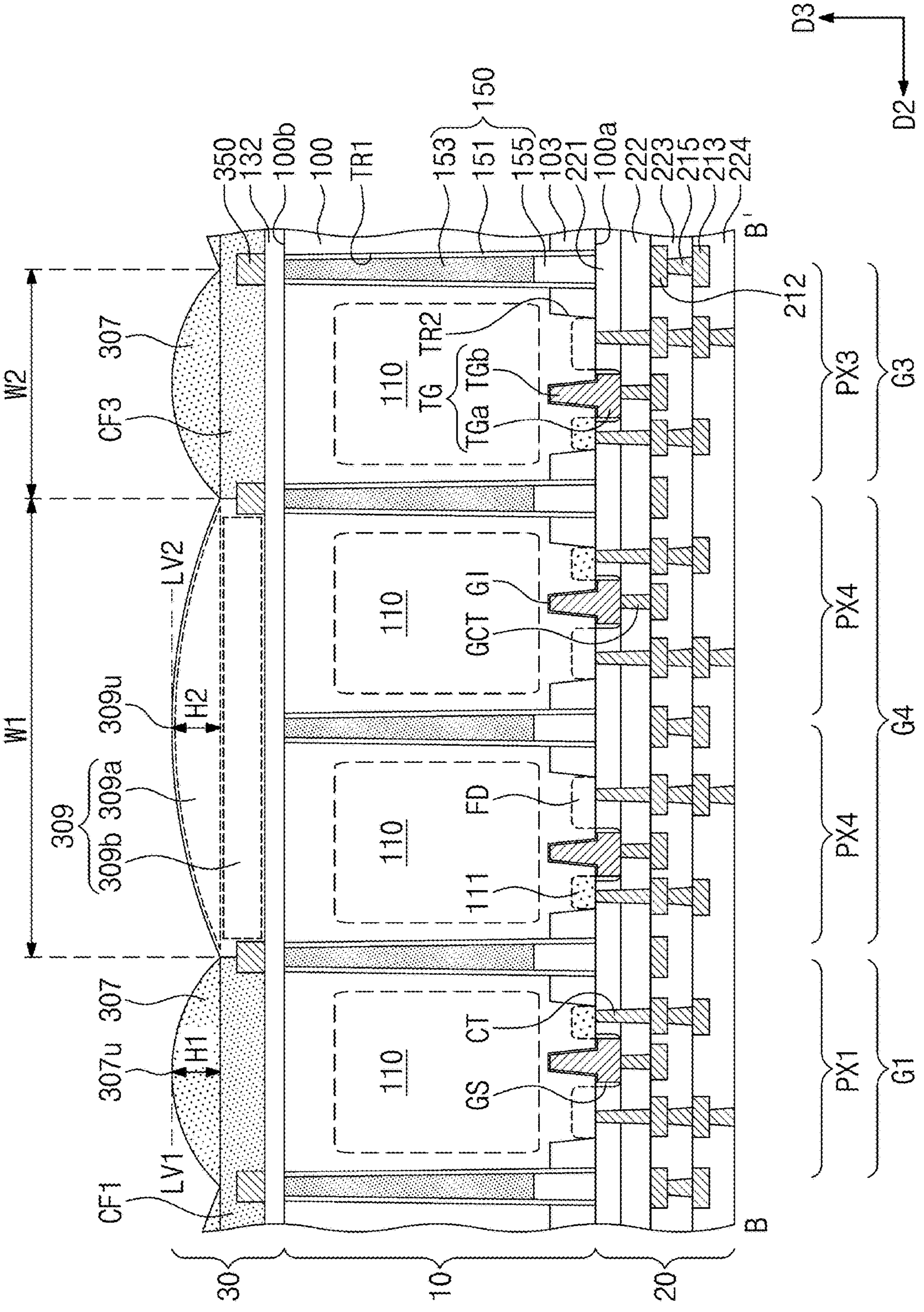

FIG. 4 illustrates an enlarged plan view showing section M of FIG. 2. FIGS. 5A and 5B illustrate cross-sectional views respectively taken along lines A-A' and B-B' of FIG. 4.

Referring to FIGS. 4, 5A, and 5B, an image sensor may include a photoelectric conversion layer 10, gate electrodes TG, SF, SEL, and RG, a first wiring layer 20, and an optical transmission layer 30. The photoelectric conversion layer 10 may include a first substrate 100, a pixel separation pattern 150, and a device isolation pattern 103.

The first substrate 100 may have a first surface 100*a* and a second surface 100*b* that are opposite to each other. The first substrate 100 may receive light incident on the second surface 100*b* thereof. The first wiring layer 20 may be disposed on the first surface 100*a* of the first substrate 100, and the optical transmission layer 30 may be disposed on the second surface 100*b* of the first substrate 100. The first substrate 100 may be a silicon substrate or a silicon-on-insulator (SOI) substrate. The semiconductor substrate may be, for example, a silicon substrate, a germanium substrate, or a silicon-germanium substrate. The first substrate 100 may include first conductivity type impurities. For example, the first conductivity type impurities may include p-type impurities, such as one or more of aluminum (Al), boron (B), indium (In), and gallium (Ga).

The first substrate 100 may include a plurality of unit pixels PX defined by the pixel separation pattern 150. The plurality of unit pixels PX may be arranged in a matrix shape along the first and second directions D1 and D2 that intersect each other. The first substrate 100 may include photoelectric conversion regions 110. The photoelectric conversion regions 110 may be provided on corresponding unit pixels PX in the first substrate 100. The photoelectric conversion regions 110 may perform similar functions as those of the photodiodes PD1, PD2, PD3, and PD4 of FIG. 1. The photoelectric conversion regions 110 may be zones where second conductivity type impurities are doped into the first substrate 100. The second conductivity type impurities may have a conductivity type opposite to a conductivity type of the first conductivity type impurities. The second conductivity type impurities may include n-type impurities, such as one or more of phosphorus, arsenic, bismuth, and antimony. For example, the photoelectric conversion regions 110 may be adjacent to the second surface 100*b* of the first substrate 100. The photoelectric conversion regions 110 may be disposed closer to the second surface 100*b* than to the first surface 100*a*. According to another example embodiment, the photoelectric conversion regions 110 may be adjacent to the first surface 100*a* of the first substrate 100. The photoelectric conversion regions 110 may be disposed closer to the first surface 100*a* than to the second surface 100*b*. For example, each of the photoelectric conversion regions 110 may include a first section adjacent to the first surface 100*a* and a second section adjacent to the second surface 100*b*. The photoelectric conversion region 110 may have a difference in impurity concentration between the first section and the second section. Therefore, the photoelectric conversion region 110 may have a potential slope between the first and second surfaces 100*a* and 100*b* of the first substrate 100. According to another example embodiment, the photoelectric conversion region 110 may have no potential slope between the first and second surfaces 100*a* and 100*b* of the first substrate 100.

The first substrate 100 and the photoelectric conversion region 110 may constitute a photodiode. For example, a photodiode may be constituted by a p-n junction between the first substrate 100 of the first conductivity type and the photoelectric conversion region 110 of the second conductivity type. The photoelectric conversion region 110 which constitutes the photodiode may generate and accumulate photo-charges in proportion to intensity of incident light.

The first substrate 100 may be provided therein with the pixel separation pattern 150 that defines the unit pixels PX. For example, the pixel separation pattern 150 may be provided between the unit pixels PX of the first substrate 100. When viewed in a plan view, the pixel separation pattern 150 may have a grid structure. When viewed in a plan view, the pixel separation pattern 150 may be provided adjacent to and completely surround each of the unit pixels PX. The pixel separation pattern 150 may be provided in a first trench TR1. The first trench TR1 may be recessed from the first surface 100*a* of the first substrate 100. The pixel separation pattern 150 may extend from the first surface 100*a* toward the second surface 100*b* of the first substrate 100. The pixel separation pattern 150 may be a deep trench isolation (DTI) layer. The pixel separation pattern 150 may penetrate the first substrate 100. The pixel separation pattern 150 may have a vertical height substantially the same as a vertical height of the first substrate 100. For example, the pixel separation pattern 150 may have a width that gradually decreases in a direction from the first surface 100*a* to the second surface 100*b* of the first substrate 100.

The pixel separation pattern 150 may include a first separation pattern 151, a second separation pattern 153, and a capping pattern 155. The first separation pattern 151 may be provided along a sidewall of the first trench TR1. The first separation pattern 151 may include, for example, a silicon-based dielectric material (e.g., silicon nitride, silicon oxide, and/or silicon oxynitride) and/or a high-k dielectric material (e.g., hafnium oxide and/or aluminum oxide). According to another example embodiment, the first separation pattern 151 may include a plurality of layers, which may include different materials from each other. The first separation pattern 151 may have a refractive index less than a refractive index of the first substrate 100. Accordingly, crosstalk may be prevented or reduced between the unit pixels PX of the first substrate 100.

The second separation pattern 153 may be provided in the first separation pattern 151. For example, the second separation pattern 153 may have a sidewall provided adjacent to and surrounded by the first separation pattern 151. The first separation pattern 151 may be interposed between the second separation pattern 153 and the first substrate 100. The first separation pattern 151 may separate the second separation pattern 153 from the first substrate 100. Therefore, when the image sensor operates, the second separation pattern 153 may be electrically separated from the first substrate 100. The second separation pattern 153 may include a crystalline semiconductor material, such as polycrystalline silicon. For example, the second separation pattern 153 may further include dopants, which may include first conductivity type impurities or second conductivity type impurities. For example, the second separation pattern 153 may include doped polycrystalline silicon. As another example, the second separation pattern 153 may include undoped crystalline semiconductor material. For example, the second separation pattern 153 may include undoped polycrystalline silicon. The term "undoped" may indicate that no doping process is intentionally performed. The dopants may include n-type dopants or p-type dopants.

The capping pattern 155 may be provided at a bottom surface of the second separation pattern 153. The capping pattern 155 may be disposed adjacent to the first surface 100*a* of the first substrate 100. The capping pattern 155 may have a bottom surface coplanar with the first surface 100*a* of the first substrate 100. The capping pattern 155 may include a non-conductive material. For example, the capping pattern 155 may include a dielectric material (e.g., silicon nitride, silicon oxide, and/or silicon oxynitride) and/or a high-k dielectric material (e.g., hafnium oxide and/or aluminum oxide). Therefore, the pixel separation pattern 150 may prevent photo-charges generated from light incident on each unit pixel PX from drifting into neighboring unit pixels PX. For example, the pixel separation pattern 150 may prevent crosstalk between the unit pixels PX.

The device isolation pattern 103 may be provided in the first substrate 100. For example, the device isolation pattern 103 may be provided in a second trench TR2. The second trench TR2 may be recessed from the first surface 100*a* of the first substrate 100. The device isolation pattern 103 may be a shallow trench isolation (STI) layer. The device isolation pattern 103 may have a bottom surface which is provided in the first substrate 100. The device isolation pattern 103 may have a width that gradually decreases in a direction from the first surface 100*a* to the second surface 100*b* of the first substrate 100. The bottom surface of the device isolation pattern 103 may be vertically spaced apart from the photoelectric conversion regions 110. The pixel separation pattern 150 may overlap a portion of the device isolation pattern 103. At least a portion of the device isolation pattern 103 may be disposed on and in contact with a sidewall of the pixel separation pattern 150. A stepwise structure may be formed on a sidewall and the top surface of the device isolation pattern 103 and the sidewall of the pixel separation pattern 150. The pixel separation pattern 150 may penetrate the device isolation pattern 103. The device isolation pattern 103 may have a depth less than a depth of the pixel separation pattern 150. The device isolation pattern 103 may include a silicon-based dielectric material. For example, the device isolation pattern 103 may include one or more of silicon nitride, silicon oxide, and silicon oxynitride. For another example, the device isolation pattern 103 may include a plurality of layers, which may include different materials from each other.

The first substrate 100 may be provided on its first surface 100*a* with the transfer transistor TX, the source follower transistor SX, the reset transistor RX, and the selection transistor AX. The transfer transistor TX may be electrically connected to the photoelectric conversion region 110. The transfer transistor TX may include a transfer gate TG and a floating diffusion region FD. The transfer gate TG may include a first part TGa provided on the first surface 100*a* of the first substrate 100 and a second part TGb that extends from the first part TGa into the first substrate 100. A maximum width in the second direction D2 of the first part TGa may be greater than a maximum width in the second direction D2 of the second part TGb. A gate dielectric pattern GI may be interposed between the transfer gate TG and the first substrate 100. The gate dielectric pattern GI may extend along a top surface ( ) and sidewalls of the second part TGb. The floating diffusion region FD may be adjacent to one side of the transfer gate TG. The floating diffusion region FD may have the second conductivity type (e.g., n-type) opposite to a conductivity type of the first substrate 100.

The gate electrodes TG, SEL, SF, and RG may be provided on the first surface 100*a* of the first substrate 100. The gate electrodes TG, SEL, SF, and RG may include a transfer gate TG, a selection gate SEL, a source follower gate SF, and a reset gate RG. The gate dielectric pattern GI may be interposed between the first substrate 100 and each of the transfer gate TG, the selection gate SEL, the source follower gate SF, and the reset gate RG. A gate spacer GS may be provided on a sidewall of each of the gate electrodes TG, SEL, SF, and RG. The gate spacer GS may include, for example, silicon nitride, silicon carbonitride, or silicon oxynitride.

Each of the unit pixels PX may include an impurity region 111 provided in the first substrate 100. The impurity region 111 may be adjacent to the first surface 100*a* of the first substrate 100. The impurity region 111 may be adjacent to one side of the device isolation pattern 103. The floating diffusion region FD may be provided on one side of the transfer gate TG, and the impurity region 111 may be provided on another side of the transfer gate TG. The impurity region 111 may have a top surface spaced apart from the photoelectric conversion region 110. The impurity region 111 may be a doped area. The impurity region 111 may have, for example, the first conductivity type (e.g., p-type) the same as a conductivity type of the first substrate 100. The impurity region 111 may be a ground area.

The first wiring layer 20 may include dielectric layers 221, 222, 223, and 224, wiring lines 212 and 213, vias 215, contacts CT, and gate contacts GCT. The dielectric layers 221, 222, 223, and 224 may include a first dielectric layer 221, a second dielectric layer 222, a third dielectric layer 223, and a fourth dielectric layer 224. The first dielectric layer 221 may cover the first surface 100*a* of the first substrate 100. The second dielectric layer 222 may be provided on the first dielectric layer 221. The first and second dielectric layers 221 and 222 may be provided between the first surface 100*a* of the first substrate 100 and the wiring lines 212 and 213, thereby covering the gate electrodes TG, SEL, SF, and RG. The third dielectric layer 223 may be provided on the second dielectric layer 222, and the fourth dielectric layer 224 may be provided on the third dielectric layer 223. The first, second, third, and fourth dielectric layers 221, 221, 223, and 224 may include a non-conductive material. For example, the first, second, third, and fourth dielectric layers 221, 222, 223, and 224 may include a silicon-based dielectric material, such as one or more of silicon oxide, silicon nitride, and silicon oxynitride.

The wiring lines 212 and 213 may be provided on the second dielectric layer 222. The wiring lines 212 and 213 may be vertically connected through the gate contacts GCT to ones of the transfer transistors TX, the source follower transistors SX, the reset transistors RX, and the selection transistors AX. The wiring lines 212 and 213 may be vertically connected through the contacts CT to the floating diffusion region FD and the impurity region 111. The contacts CT and the gate contacts GCT may penetrate the first and second dielectric layers 221 and 222. The first wiring layer 20 may signally process the electrical signals converted in the photoelectric conversion regions 110. An arrangement of the wiring lines 212 and 213 may not depend on an arrangement of the photoelectric conversion regions 110, and may be variously changed. The wiring lines 212 and 213 may include first wiring lines 212 and second wiring lines 213. The first wiring lines 212 may be provided in the third dielectric layer 223. The second wiring lines 213 may be provided in the fourth dielectric layer 224. The vias 215 may be provided in the third and fourth dielectric layers 223 and 224. The vias 215 may electrically connect the first and second wiring lines 212 and 213 to each other. The first and second wiring lines 212 and 213, the vias 215, the contacts CT, and the gate contacts GCT may include a metallic material. For example, the first and second wiring lines 212 and 213, the vias 215, the contacts CT, and the gate contacts GCT may include copper (Cu).

Referring back to FIG. 3, the image sensor may further include a circuit chip 2000. The circuit chip 2000 may be stacked on the sensor chip 1000. The circuit chip 2000 may include a second substrate 40 and a second wiring layer 45. The second wiring layer 45 may be interposed between the first wiring layer 20 and the second substrate 40.

On the optical black area OB, the first substrate 100 may be provided thereon with a first connection structure 50, a first pad terminal 81, and a bulk color filter 90. The first connection structure 50 may include a first light-shield pattern 51, a first dielectric pattern 53, and a first capping pattern 55. The first light-shield pattern 51 may be disposed on the second surface 100*b* of the first substrate 100. The first light-shield pattern 51 may cover a backside dielectric layer 132 on the second surface 100*b* which will be discussed below, and conformally cover an inner wall of each of third and fourth trenches TR3 and TR4. The first light-shield pattern 51 may penetrate the photoelectric conversion layer 10, the first wiring layer 20, and the second wiring layer 45, and may electrically connect the photoelectric conversion layer 10 to the first wiring layer 20. For example, the first light-shield pattern 51 may be in contact with wiring lines in the first wiring layer 20 and with the pixel separation pattern 150 in the photoelectric conversion layer 10. Therefore, the first connection structure 50 may be electrically connected to the wiring lines in the first wiring layer 20. The first light-shield pattern 51 may block incidence of light onto the optical black area OB.

The third trench TR3 may be provided therein with the first pad terminal 81 that fills an unoccupied portion of the third trench TR3. The first pad terminal 81 may include a metallic material, such as aluminum. The first pad terminal 81 may be connected to the pixel separation pattern 150, more specifically the second separation pattern 153. Therefore, a negative voltage may be applied through the first pad terminal 81 to the pixel separation pattern 150.

The first light-shield pattern 51 may be provided thereon with the first dielectric pattern 53 that fills an unoccupied portion of the fourth trench TR4. The first dielectric pattern 53 may penetrate the photoelectric conversion layer 10 and the first wiring layer 20. The first capping pattern 55 may be provided on the first dielectric pattern 53. The first capping pattern 55 may include the same material as a material of the capping pattern 155.

The bulk color filter 90 may be provided on the first pad terminal 81, the first light-shield pattern 51, and the first capping pattern 55. The bulk color filter 90 may cover the first pad terminal 81, the first light-shield pattern 51, and the first capping pattern 55. A first protection layer 71 may be provided on and cover the bulk color filter 90.

A photoelectric conversion region 110' and a dummy region 112 may be provided on the optical black area OB of the first substrate 100. For example, the photoelectric conversion region 110' may be doped with impurities having the second conductivity type (e.g., n-type) different from the first conductivity type. The photoelectric conversion region 110' may have a similar structure to a structure of the photoelectric conversion region 110 discussed in FIG. 5A, but may not generate electrical signals from light incident thereon. The dummy region 112 may not be doped with impurities. The photoelectric conversion region 110' and the dummy region 112 may generate signals that are used as information to remove subsequent process noise.

On the pad area PAD, the first substrate 100 may be provided thereon with a second connection structure 60, a second pad terminal 83, and a second protection layer 73. The second connection structure 60 may include a second light-shield pattern 61, a second dielectric pattern 63, and a second capping pattern 65.

The second light-shield pattern 61 may be provided on the second surface 100*b* of the first substrate 100. For example, the second light-shield pattern 61 may cover a backside dielectric layer 132 on the second surface 100*b* which will be discussed below, and may conformally cover an inner wall of each of fifth and sixth trenches TR5 and TR6. The second light-shield pattern 61 may penetrate the photoelectric conversion layer 10 and a portion of the first wiring layer 20. For example, the second light-shield pattern 61 may be in contact with wiring lines 231 and 232 in the second wiring layer 45. The second light-shield pattern 61 may include a metallic material, such as tungsten.

The second pad terminal 83 may be provided in the fifth trench TR5. The second light-shield pattern 61 may be provided thereon with the second pad terminal 83 that fills an empty portion of the fifth trench TR5. The second pad terminal 83 may include a metallic material, such as aluminum. The second pad terminal 83 may serve as an electrical connection path between the image sensor and the outside. The second dielectric pattern 63 may fill an empty portion of the sixth trench TR6. The second dielectric pattern 63 may penetrate the photoelectric conversion layer 10 and the first wiring layer 20. The second capping pattern 65 may be provided on the second dielectric pattern 63. The second capping pattern 65 may include the same material as a material of the capping pattern 155. The second protection layer 73 may cover the second capping pattern 65 and a portion of the second light-shield pattern 61.

A current applied through the second pad terminal 83 may flow toward the pixel separation pattern 150 by way of the second light-shield pattern 61, the wiring lines 231 and 232 in the second wiring layer 45, and the first light-shield pattern 51. The photoelectric conversion regions 110 and 110' and the dummy region 112 may generate electrical signals, and the electrical signals may be outwardly transmitted through the wiring lines 231 and 232 in the second wiring layer 45, the second light-shield pattern 61, and the second pad terminal 83.

Referring back to FIGS. 4, 5A, and 5B, the unit pixels PX may include first pixels PX1, second pixels PX2, third pixels PX3, and fourth pixels PX4. The first substrate 100 of the image sensor may include a first pixel domain G1, a second pixel domain G2, a third pixel domain G3, and a fourth pixel domain G4. The first pixel domain G1 may include a plurality of first pixels PX1. The second pixel domain G2 may include a plurality of second pixels PX2. The third pixel domain G3 may include a plurality of third pixels PX3. The fourth pixel domain G4 may include a plurality of fourth pixels PX4. Each of the first to fourth pixel domains G1 to G4 may have a 2×2 pixel structure. For example, each of the first, second, third, and fourth pixel domains G1, G2, G3, and G4 may include four unit pixels PX.

The first to fourth pixel domains G1 to G4 may be two-dimensionally arranged. The fourth pixel domains G4 may be arranged in a diagonal direction. The diagonal direction may be a direction that makes an angle of about 45 degrees relative to the first direction D1 and the second direction D2. The fourth pixel domains G4 may be arranged in the diagonal direction to cross each other. One of the first, second, and third pixel domains G1, G2, and G3 may be disposed between the fourth pixel domains G4 that are adjacent to each other in the first direction D1 or the second direction D2. On first and second rows, the first pixel domain G1 and the second pixel domain G2 may be alternately arranged across the fourth pixel domain G4. On third and fourth rows, the first pixel domain G1 and the third pixel domain G3 may be alternately arranged across the fourth pixel domain G4. On first and second columns, the first pixel domain G1 and the third pixel domain G3 may be alternately arranged across the fourth pixel domain G4. On third and fourth columns, the first pixel domain G1 and the second pixel domain G2 may be alternately arranged across the fourth pixel domain G4.

The optical transmission layer 30 may include a first color filter CF1, a second color filter CF2, a third color filter CF3, first microlenses 307, and second microlenses 309. The optical transmission layer 30 may condense and filter externally incident light, and the photoelectric conversion layer 10 may be provided with the focused and filtered light.

For example, the first, second, and third color filters CF1, CF2, and CF3 may be provided on the second surface 100*b* of the first substrate 100. The first color filter CF1 may be provided on the first pixel domain G1. The first color filter CF1 may entirely cover the first pixels PX1 of the first pixel domain G1. For example, the first color filter CF1 may vertically overlap all of the first pixels PX1. The second color filter CF2 may be provided on the second pixel domain G2. The second color filter CF2 may entirely cover the second pixels PX2 of the second pixel domain G2. For example, the second color filter CF2 may vertically overlap all of the second pixels PX2. The third color filter CF3 may be provided on the third pixel domain G3. The third color filter CF3 may entirely cover the third pixels PX3 of the third pixel domain G3. For example, the third color filter CF3 may vertically overlap all of the third pixels PX3. The first, second, and third color filters CF1, CF2, and CF3 may be disposed on a backside dielectric layer 132 which will be discussed below.

Each of the first, second, and third color filters CF1, CF2, and CF3 may include a primary color filter. The first, second, and third color filters CF1, CF2, and CF3 may include color filters different from each other. For example, the first color filter CF1 may include a green color filter, the second color filter CF2 may include a red color filter, and the third color filter CF3 may include a blue color filter. As another example, the first, second, and third color filters CF1, CF2, and CF3 may include different colors such as cyan, magenta, or yellow.

The first microlenses 307 may be provided on each of the first, second, and third pixel domains G1, G2, and G3. The first microlenses 307 may be disposed on corresponding first pixels PX1 on the first pixel domain G1. The first microlenses 307 may be disposed on corresponding second pixels PX2 on the second pixel domain G2. The first microlenses 307 may be disposed on corresponding third pixels PX3 on the third pixel domain G3. Four first microlenses 307 may be located on each of the first, second, and third pixel domains G1, G2, and G3. For example, each of the first, second, and third pixel domains G1, G2, and G3 may have a tetra cell structure. For the image sensor according to example embodiments, the pixel domains G1, G2, and G3 with colors may each have a tetra cell structure.

The first microlens 307 may be disposed on one of the first, second, and third color filters CF1, CF2, and CF3. A second width W2 may be given as a maximum width of the first microlens 307. The second width W2 may be substantially the same as a width of the unit pixel PX. The first microlens 307 may have a convex shape to condense light that is incident on the unit pixel PX. The first microlens 307 may have a hemispheric cross-section. When viewed in a plan view, the first microlens 307 may vertically overlap the unit pixel PX of one of the first, second, and third pixels PX1, PX2, and PX3. When viewed in a plan view, the first microlens 307 may have a circular shape.

The second microlens 309 may be provided on the fourth pixel domain G4. The second microlens 309 may be disposed on a backside dielectric layer 132 which will be described below. The second microlens 309 may vertically overlap at least a portion of the fourth pixel PX4 on the fourth pixel domain G4. One second microlens 309 may be provided on one fourth pixel domain G4. For example, the fourth pixel domain G4 may have a Q cell structure.

A first width W1 may be given as a maximum width of the second microlens 309. The first width W1 may be substantially the same as a width of the fourth pixel domain G4. The first width W1 may be greater than the second width W2. For example, the first width W1 may be about twice the second width W2. The second microlens 309 may have a convex shape to condense light that is incident to the unit pixel PX. The second microlens 309 may have a hemispheric cross-section. When viewed in a plan view, the second microlens 309 may have a circular shape.

The second microlens 309 may include a lens part 309*a* having a curved top surface and a flat part 309*b* interposed between the lens part 309*a* and a backside dielectric layer 132 which will be discussed below. The top surface of the lens part 309*a* may be a top surface 309*u* of the second microlens 309. The flat part 309*b* may be located at substantially the same level as a level of the first, second, and third color filters CF1, CF2, and CF3. The flat part 309*b* may have a bottom surface substantially coplanar with a bottom surface of each of the first, second, and third color filters CF1, CF2, and CF3. The bottom surface of the flat part 309*b* may be a bottom surface of the second microlens 309. The flat part 309*b* may have a height substantially the same as a height of each of the first, second, and third color filters CF1, CF2, and CF3. The second microlens 309 may function both as a white color filter and as a microlens that condenses light. The fourth pixels PX4 may be white pixels. For the image sensor according to example embodiments, a white pixel domain may have a Q cell structure.

The image sensor according to example embodiments may have a WQ cell structure in which a tetra cell structure and a Q cell structure are combined with each other. Therefore, the image sensor in which the WQ cell structure is used may have improved autofocus performance and increased sensitivity compared to a case in which is used one of the tetra cell structure and the Q cell structure. As a result, the image sensor may improve in optical properties.

The image sensor may further include a light-shield pattern 350. The light-shield pattern 350 may be interposed between two neighboring ones of the color filters CF1, CF2, and CF3, and may separate the color filters CF1, CF2, and CF3 from each other and the second microlenses 309 from each other. For example, the color filters CF1, CF2, and CF3 may be optically separated from each other by the light-shield pattern 350, and the second microlenses 309 may be optically separated from each other by the light-shield pattern 350. The light-shield pattern 350 may be disposed on a backside dielectric layer 132. The light-shield pattern 350 may vertically overlap a portion of the pixel separation pattern 150. The light-shield pattern 350 may include metal, metal nitride, or a low-refractive material. For example, the light-shield pattern 350 may include titanium nitride. The low-refractive material may include a polymer and nano-particles in the polymer, and may have dielectric properties. The nano-particles may include, for example, silica.

The light-shield pattern 350 may be provided on the pixel separation pattern 150 between neighboring first pixels PX1, the pixel separation pattern 150 between neighboring second pixels PX2, and the pixel separation pattern 150 between neighboring third pixels PX3. In addition, the light-shield pattern 350 may be provided on the pixel separation pattern 150 between neighboring first and fourth pixels PX1 and PX4, the pixel separation pattern 150 between neighboring second and fourth pixels PX2 and PX4, and the pixel separation pattern 150 between neighboring third and fourth pixels PX3 and PX4. The light-shield pattern 350 may not be provided on the pixel separation pattern 150 between neighboring fourth pixels PX4. When viewed in a plan view, the light-shield pattern 350 may have a grid structure. When viewed in a plan view, the light-shield pattern 350 may be provided adjacent to and completely surround each of the first, second, and third pixels PX1, PX2, and PX3. When viewed in a plan view, the light-shield pattern 350 may be provided adjacent to and completely surround the fourth pixel domain G4.

The image sensor may further include a backside dielectric layer 132. The backside dielectric layer 132 may be interposed between the first substrate 100 and the color filters CF1, CF2, and CF3, between the first substrate 100 and the second microlens 309, and between the pixel separation pattern 150 and the light-shield pattern 350. The backside dielectric layer 132 may include a bottom antireflective coating (BARC) layer. The backside dielectric layer 132 may include a plurality of layers. For example, the backside dielectric layer 132 may include a fixed charge layer, a buried dielectric layer, a silicon nitride layer, and a capping layer that are stacked on the second surface 100*b* of the first substrate 100. The fixed charge layer may include metal oxide, such as stacked aluminum and hafnium oxides. The buried dielectric layer may include tetraethylorthosilicate (TEOS) or silicon oxide. The capping layer may include metal oxide, such as hafnium oxide. The backside dielectric layer 132 may exclude at least one selected from the fixed charge layer, the buried dielectric layer, the silicon nitride layer, and the capping layer.

The first microlens 307 may have an uppermost part located at a first level LV1. The second microlens 309 may have an uppermost part located at a second level LV2. A first height H1 may be a maximum height of the first microlens 307. The first level LV1 and the second level LV2 may be substantially the same as each other. For example, a difference between the first and second levels LV1 and LV2 may be present within about 2% of the first height H1. A second height H2 may be a maximum height of the lens part 309*a* of the second microlens 309. The first height H1 and the second height H2 may be substantially the same as each other. The first microlens 307 may have a top surface 307*u* whose curvature is different from a curvature of the top surface 309*u* of the second microlens 309. For example, the first microlens 307 may have a top surface 307*u* whose curvature is greater than a curvature of the top surface 309*u* of the second microlens 309.

The second microlens 309 may have a refractive index greater than a refractive index of the first microlens 307. A range of about 0.30 to about 0.45 may be given as a difference in refractive index between the second microlens 309 and the first microlens 307.

When there is a large difference in level between the uppermost parts of the first and second microlens 307 and 309, a large difference in sensitivity may be provided between the unit pixels PX, and thus the image sensor may process a large amount of data to correct the large difference in sensitivity. According to example embodiments, the uppermost part of the first microlens 307 may be located at substantially the same level as a level of the uppermost part of the second microlens 309. Because the refractive index of the second microlens 309 is greater than the refractive index of the first microlens 307, even when the first and second microlenses 307 and 309 are formed to have their heights that are substantially the same as each other, it may be possible to compensate the focal length difference between the first and second microlenses 307 and 309. Therefore, a difference in sensitivity between the unit pixels PX may decrease to solve the problems mentioned above. In addition, because the refractive index of the second microlens 309 is greater than the refractive index of the first microlens 307, crosstalk may be prevented or reduced between the unit pixels PX. As a result, the image sensor may improve in optical properties.

FIGS. 6A to 6E illustrate cross-sectional views taken along line A-A' of FIG. 4, showing a method of fabricating an image sensor according to example embodiments. FIGS. 4, 5A, and 5B will also be referred to in the following description of FIGS. 6A to 6E.

Figure 6A:
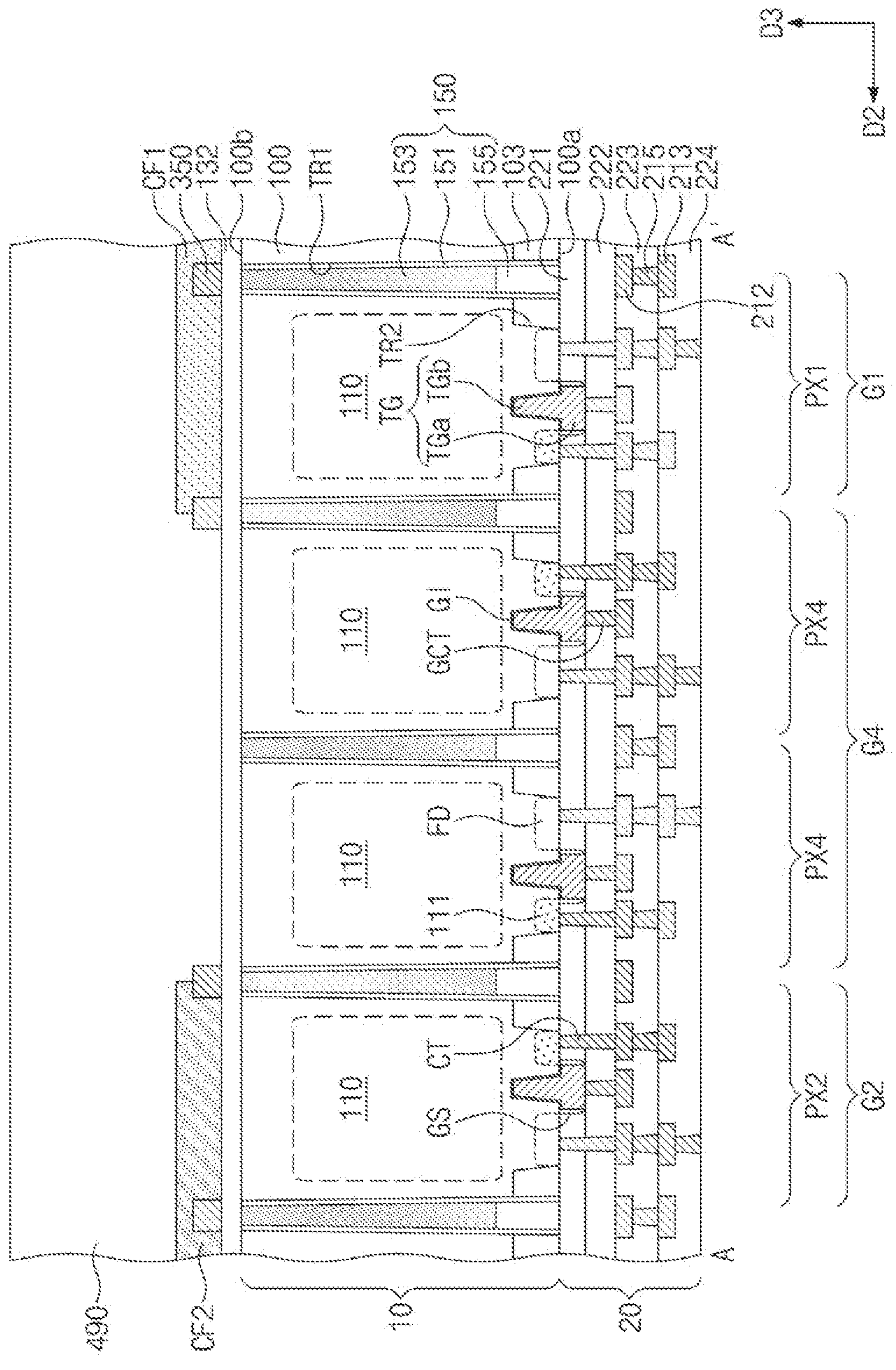
FIGS. 6A, 6B, 6C, 6D, and 6E illustrate cross-sectional views taken along line A-A' of FIG. 4, showing a method of fabricating an image sensor according to example embodiments.

Referring to FIG. 6A, a first substrate 100 may be prepared which has first, second, third, and fourth pixel domains G1, G2, G3, and G4. The first substrate 100 may be doped with impurities having a first conductivity type. The first substrate 100 may be implanted with impurities having a second conductivity type to form photoelectric conversion regions 110. A second trench TR2 and a device isolation pattern 103 may be formed on first surface 100*a* of the first substrate 100. A first trench TR1 and a pixel separation pattern 150 may be formed in the first substrate 100. The pixel separation pattern 150 may define unit pixels PX. The unit pixels PX may include first, second, third, and fourth pixels PX1, PX2, PX3, and PX4. The first, second, third, and fourth pixel domains G1, G2, G3, and G4 may include the first, second, third, and fourth pixels PX1, PX2, PX3, and PX4, respectively. The first surface 100*a* of the first substrate 100 may be implanted with impurities having the first conductivity type to form floating diffusion regions FD and impurity regions 111. Gate electrodes TG, SF, SEL, and RG discussed with reference to FIG. 1 may be formed on the first surface 100*a* of the first substrate 100. A first wiring layer 20 may be obtained by forming first, second, third, and fourth dielectric layers 221, 222, 223, and 224, wiring lines 212 and 213, contacts CT, and gate contacts GCT on the first surface 100*a* of the first substrate 100.

A second surface 100*b* of the first substrate 100 may undergo a grinding process to thin the first substrate 100. A backside dielectric layer 132, a light-shield pattern 350, and first, second, and third color filters CF1, CF2, and CF3 may be formed on the second surface 100*b* of the thinned first substrate 100. For example, the first color filter CF1 may include a green color filter, the second color filter CF2 may include a red color filter, and the third color filter CF3 may include a blue color filter.

A first preliminary lens layer 490 may be formed on the second surface 100*b* of the first substrate 100. The first preliminary lens layer 490 may cover top surfaces of the first, second, and third color filters CF1, CF2, and CF3. A coating process may be performed to form the first preliminary lens layer 490. The first preliminary lens layer 490 may have a top surface that is substantially flat.

Figure 6B:
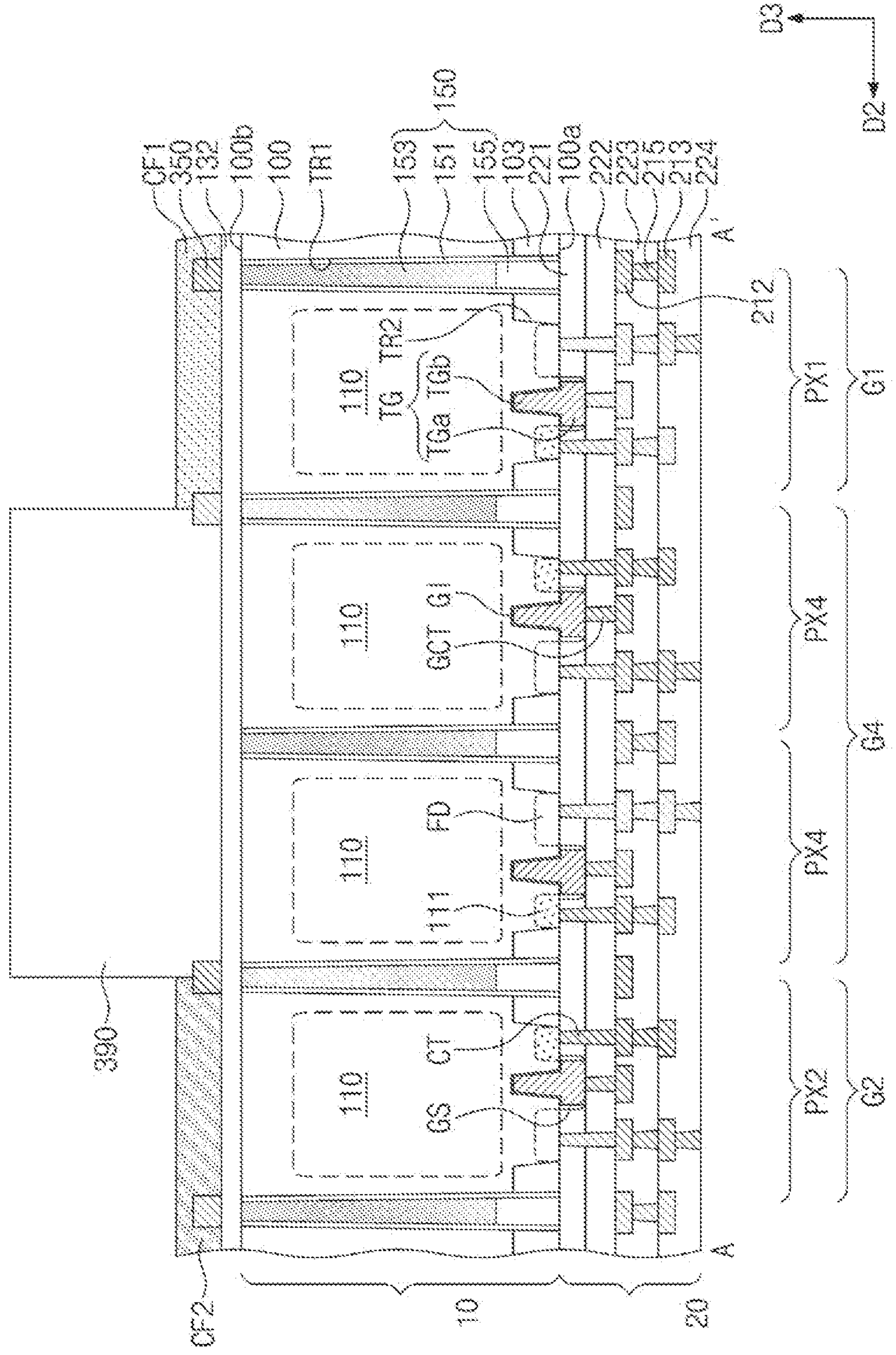

Referring to FIG. 6B, the first preliminary lens layer 490 may be patterned to form a first preliminary lens pattern 390. The patterning of the first preliminary lens layer 490 may include forming a mask pattern on the first preliminary lens layer 490 and using the mask pattern as an etching mask to etch a portion of the first preliminary lens layer 490. The mask pattern may vertically overlap the fourth pixel domain G4. Therefore, the first preliminary lens layer 490 may be etched on the first, second, and third pixel domains G1, G2, and G3. The first preliminary lens pattern 390 may vertically overlap the fourth pixel domain G4.

Figure 6C:
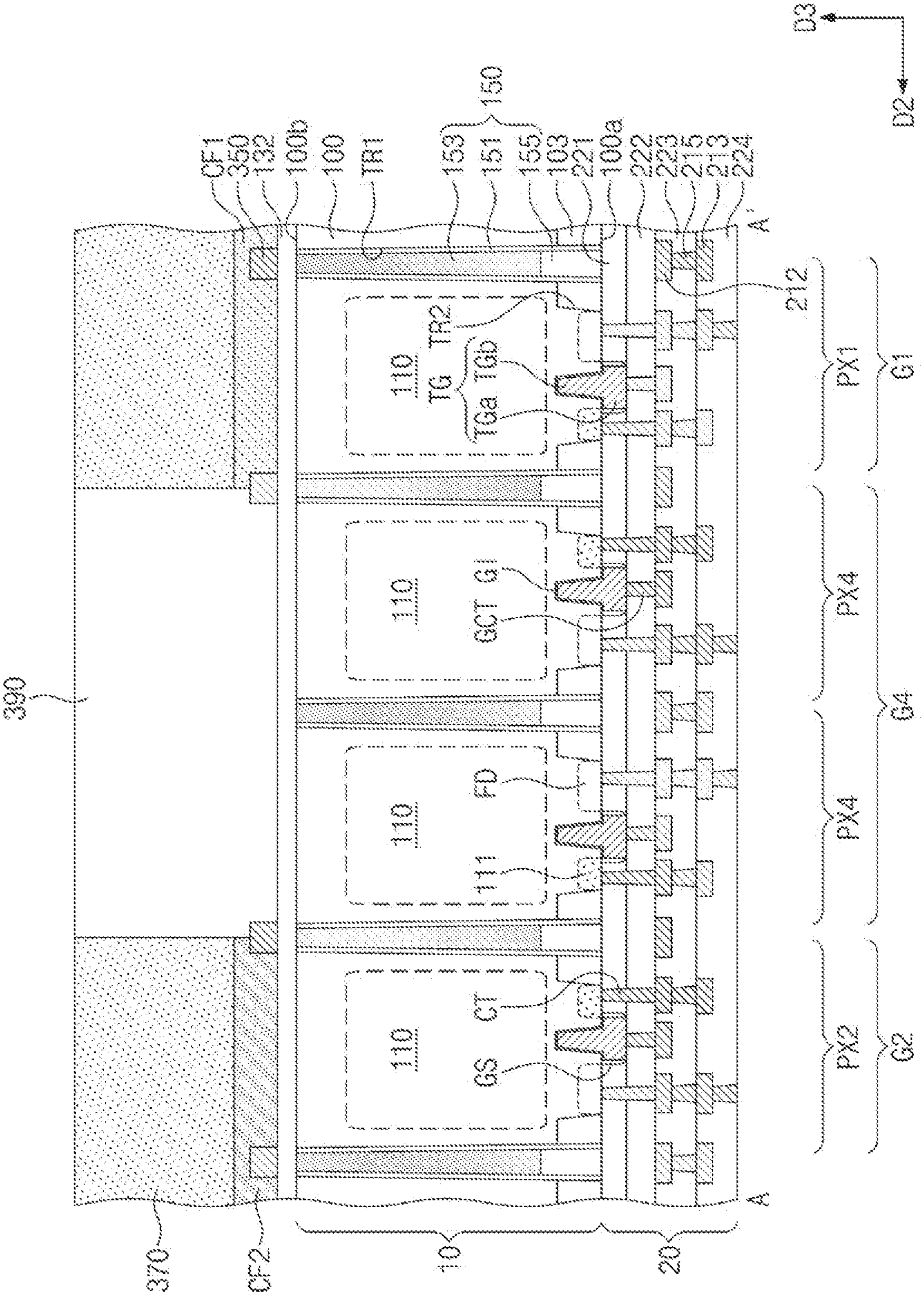

Referring to FIG. 6C, a second preliminary lens pattern 370 may be formed on the first, second, and third color filters CF1, CF2, and CF3 that are exposed by the first preliminary lens pattern 390. The second preliminary lens pattern 370 may vertically overlap one of the first, second, and third pixel domains G1, G2, and G3. The second preliminary lens pattern 370 may have a top surface substantially coplanar with a top surface of the first preliminary lens pattern 390. The first preliminary lens pattern 390 may have a refractive index greater than a refractive index of the second preliminary lens pattern 370. For example, a range of about 0.30 to about 0.45 may be given as a difference in refractive index between the first preliminary lens pattern 390 and the second preliminary lens pattern 370.

Figure 6D:
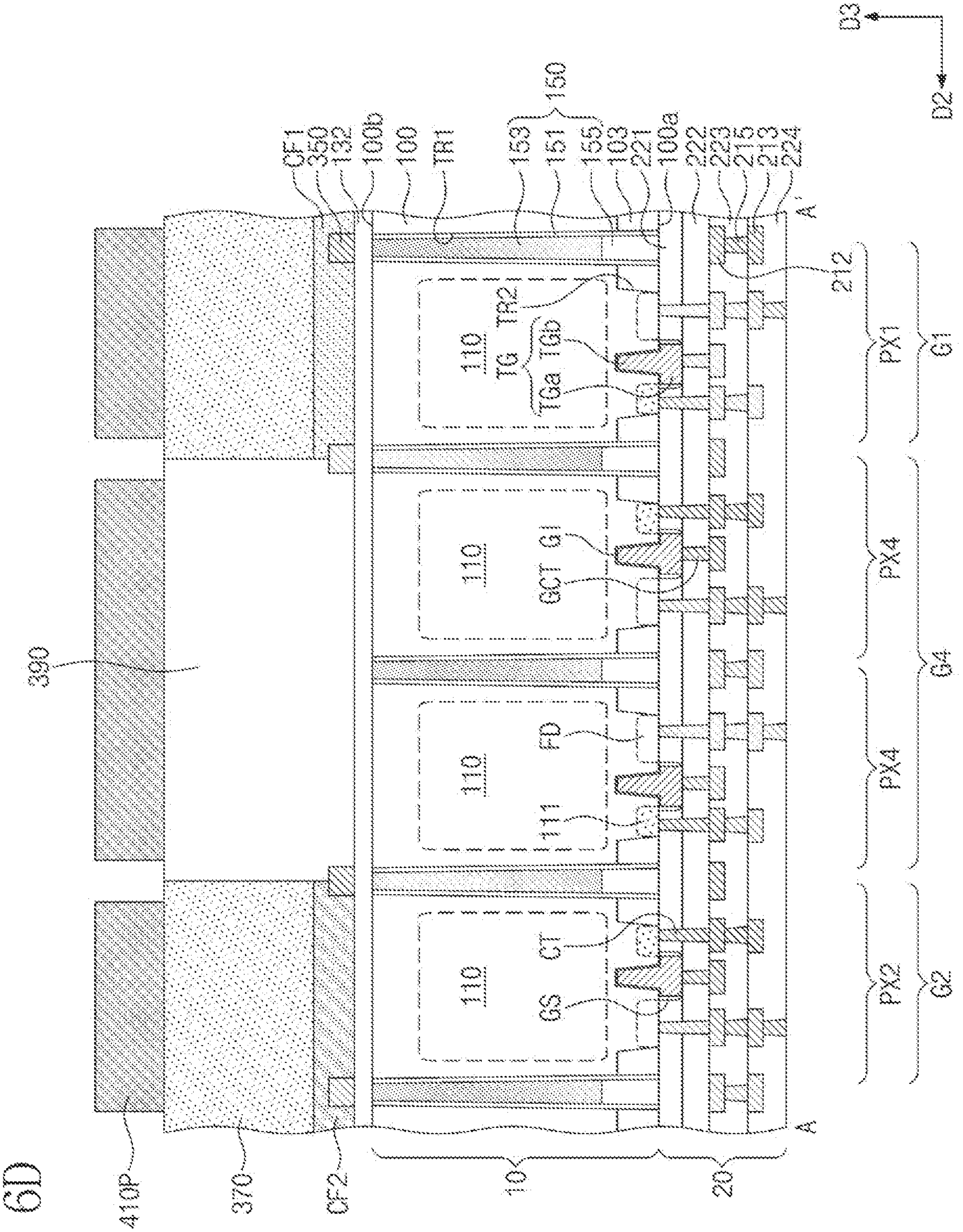

Referring to FIG. 6D, preliminary sacrificial patterns 410P may be formed on the first preliminary lens pattern 390 and the second preliminary lens pattern 370. The formation of the preliminary sacrificial patterns 410P may include forming a sacrificial layer on the first preliminary lens pattern 390 and the second preliminary lens pattern 370 and performing exposure and development processes to form the preliminary sacrificial patterns 410P. A plurality of preliminary sacrificial patterns 410P may be provided. Each of the preliminary sacrificial patterns 410P may be formed on the unit pixel PX. The preliminary sacrificial patterns 410P may be laterally spaced apart from each other. The preliminary sacrificial patterns 410P may have their heights that are substantially the same as each other.

Figure 6E:
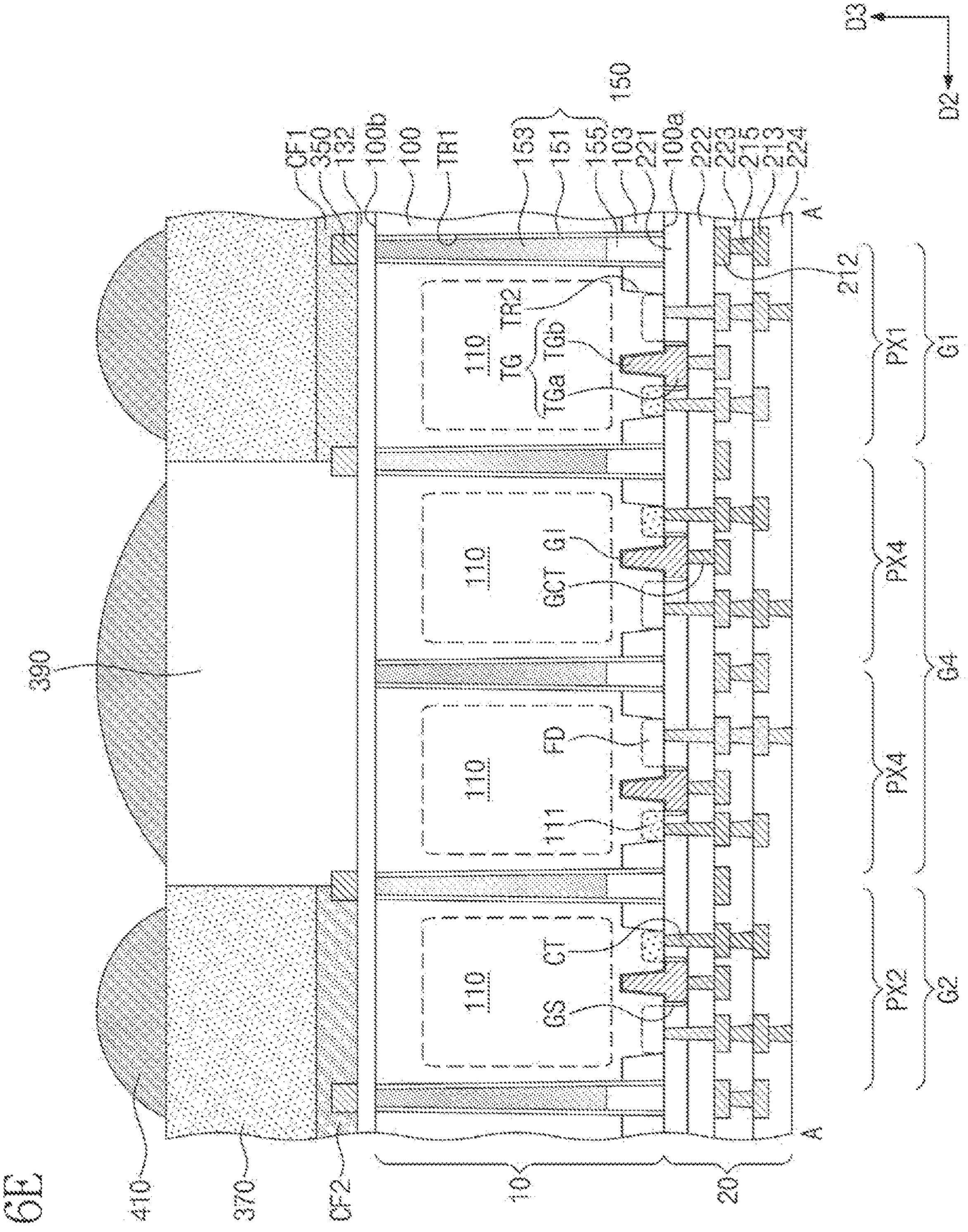

Referring to FIG. 6E, a reflow process may be performed such that the preliminary sacrificial patterns 410P may be reflowed to correspondingly form sacrificial patterns 410. During the reflow process, portions of the preliminary sacrificial patterns 410P may downwardly flow onto the top surfaces of the first and second preliminary lens patterns 390 and 370. Therefore, each of the sacrificial patterns 410 may have an upwardly convex shape. For example, each of the sacrificial patterns 410 may have a hemispherical shape. The sacrificial patterns 410 may be formed on locations that correspond to the first, second, and third pixels PX1, PX2, and PX3. The sacrificial pattern 410 on the fourth pixel domain G4 may vertically overlap at least a portion of the fourth pixel domain G4. The sacrificial pattern 410 on the fourth pixel domain G4 may have a width greater than the widths of the sacrificial patterns 410 on the first, second, and third pixel domains G1, G2, and G3.

Referring back to FIGS. 4, 5A, and 5B, the sacrificial patterns 410 may undergo an etch-back process to form a first microlens 307 and a second microlens 309. The etch-back process may transfer shapes of the sacrificial patterns 410 onto the first preliminary lens pattern 390 and the second preliminary lens pattern 370, which may result in the formation of the first microlens 307 and the second microlens 309. A shape of the first preliminary lens pattern 390 may be transferred to form the second microlens 309. A shape of the second preliminary lens pattern 370 may be transferred to form the first microlens 307.

The second microlens 309 may include a lens part 309*a* having a curved top surface and a flat part 309*b* interposed between the lens part 309*a* and the backside dielectric layer 132. The top surface of the lens part 309*a* may be a top surface 309*u* of the second microlens 309. The flat part 309*b* may be located at substantially the same level as a level of the first, second, and third color filters CF1, CF2, and CF3. The flat part 309*b* may have a bottom surface substantially coplanar with a bottom surface of each of the first, second, and third color filters CF1, CF2, and CF3. The bottom surface of the flat part 309*b* may be a bottom surface of the second microlens 309. The flat part 309*b* may have a height substantially the same as a height of each of the first, second, and third color filters CF1, CF2, and CF3.

The first microlens 307 may have an uppermost part located at a first level LV1. The second microlens 309 may have an uppermost part located at a second level LV2. A first height H1 may be a maximum height of the first microlens 307. The first level LV1 and the second level LV2 may be substantially the same as each other. For example, a difference between the first and second levels LV1 and LV2 may be present within about 2% of the first height H1. A second height H2 may be a maximum height of the second microlens 309. The first height H1 and the second height H2 may be substantially the same as each other. The first microlens 307 may have a top surface 307*u* whose curvature is different from a curvature of the top surface 309*u* of the second microlens 309. For example, the first microlens 307 may have a top surface 307*u* whose curvature is greater than a curvature of the top surface 309*u* of the second microlens 309. The second microlens 309 may have a refractive index greater than a refractive index of the first microlens 307. A range of about 0.30 to about 0.45 may be given as a difference in refractive index between the second microlens 309 and the first microlens 307. The second microlens 309 may have a maximum width greater than a maximum width of the first microlens 307.

The first microlens 307 may be first formed and then the second microlens 309 may be additionally formed. According to example embodiments, the first microlens 307 and the second microlens 309 may be formed simultaneously with each other. As a result, it may be possible to reduce manufacturing cost.

Figure 7A:
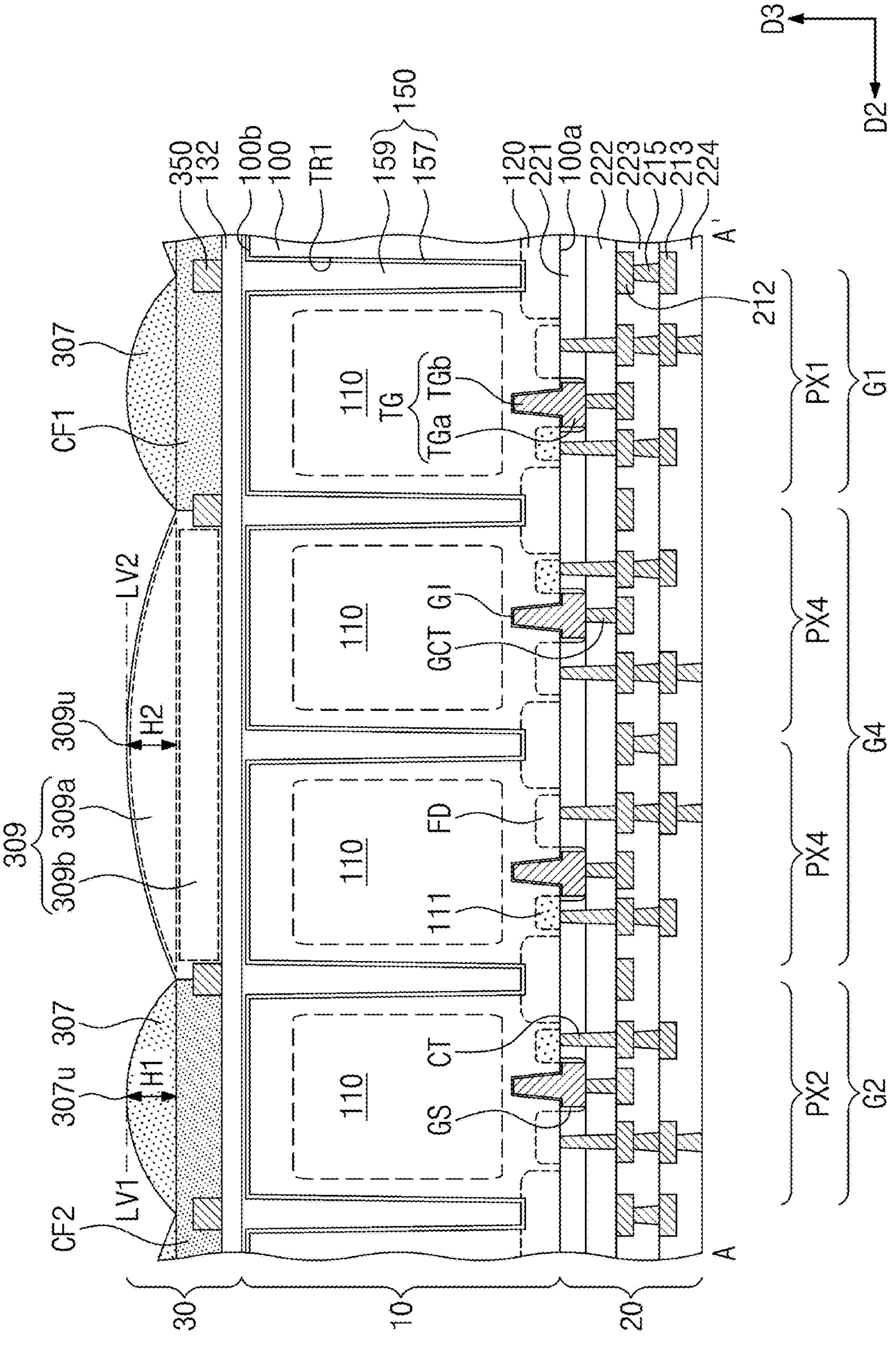
FIGS. 7A, 7B, and 7C illustrates cross-sectional views taken along line A-A' of FIG. 4, showing an image sensor according to example embodiments.
Figure 7B:
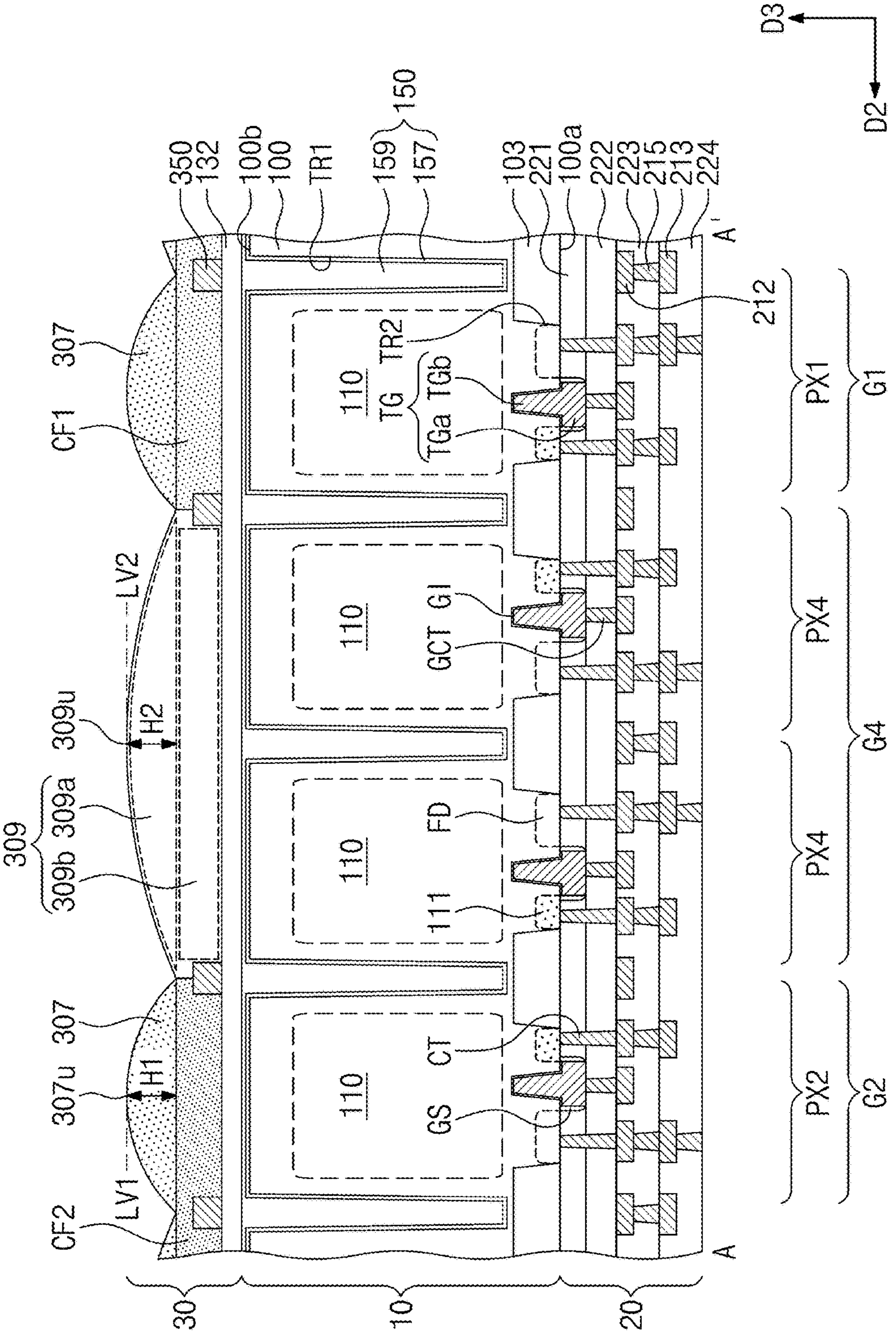
Figure 7C:
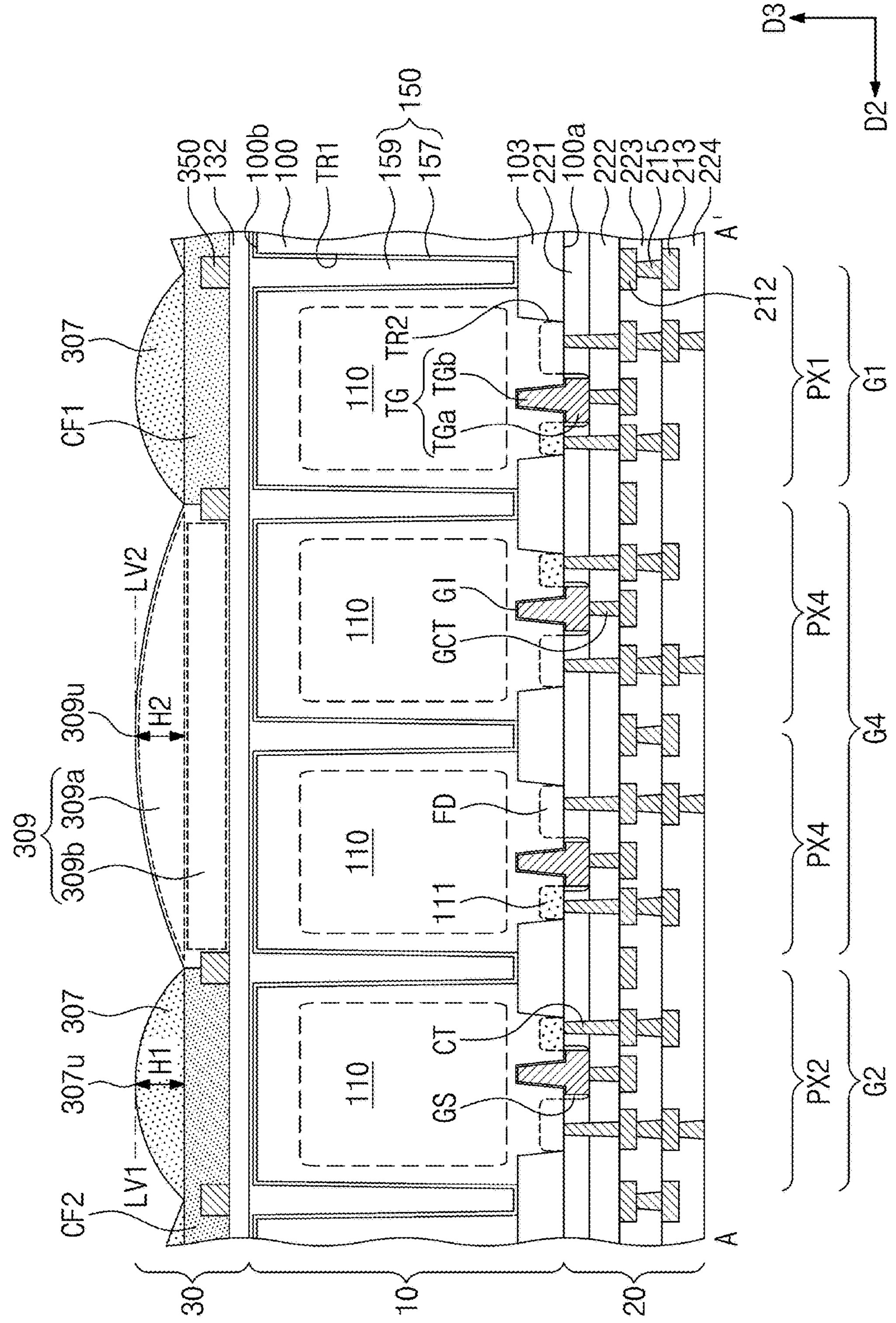

FIGS. 7A to 7C illustrates cross-sectional views taken along line A-A' of FIG. 4, showing an image sensor according to example embodiments. In the example embodiment that follows, a detailed description of features repetitive to those discussed above with reference to FIGS. 4, 5A, and 5B will be omitted, and a difference thereof will be discussed in detail.

Referring to FIG. 7A, the pixel separation pattern 150 may be provided in the first trench TR1. The first trench TR1 may be recessed from the second surface 100*b* of the first substrate 100. The first trench TR1 may have a width that decreases in a direction from the second surface 100*b* toward the first surface 100*a* of the first substrate 100.

The pixel separation pattern 150 may include a fixed charge layer 157 conformally provided along an inner wall of the first trench TR1 and a buried dielectric pattern 159 provided on the fixed charge layer 157. The fixed charge layer 157 may have a negative fixed charge. The fixed charge layer 157 may be formed of metal oxide or metal fluoride that includes at least one metal selected from hafnium (Hf), zirconium (Zr), aluminum (Al), tantalum (Ta), titanium (Ti), yttrium (Y), and lanthanide. For example, the fixed charge layer 157 may be a hafnium oxide layer or an aluminum oxide layer. Hole accumulation may occur around the fixed charge layer 157. Therefore, dark current and white spot may be effectively reduced. The buried dielectric pattern 159 may include a dielectric material with excellent step coverage. For example, the buried dielectric pattern 159 may include a silicon oxide layer. The fixed charge layer 157 may extend onto the second surface 100*b* of the first substrate 100. The buried dielectric pattern 159 may also extend onto the second surface 100*b* of the first substrate 100.

A doping region 120 may be interposed between the pixel separation pattern 150 and the first surface 100*a* of the first substrate 100. The doping region 120 may have the first conductivity type (e.g., p-type). The doping region 120 may surround a bottom surface of the pixel separation pattern 150.

Referring to FIG. 7B, the pixel separation pattern 150 may be substantially the same as the pixel separation pattern 150 of FIG. 7A, and a first device isolation pattern 103 may be provided between the pixel separation pattern 150 and the first surface 100*a* of the first substrate 100. The first device isolation pattern 103 and the pixel separation pattern 150 may be vertically spaced apart from each other. For example, a portion of the first substrate 100 may extend between the first device isolation pattern 103 and the pixel separation pattern 150.

Referring to FIG. 7C, the pixel separation pattern 150 may be substantially the same as the pixel separation pattern 150 of FIG. 7A, and a first device isolation pattern 103 may be in contact with the pixel separation pattern 150. The first device isolation pattern 103 may be interposed between the pixel separation pattern 150 and the first surface 100*a* of the first substrate 100.

Figure 8:
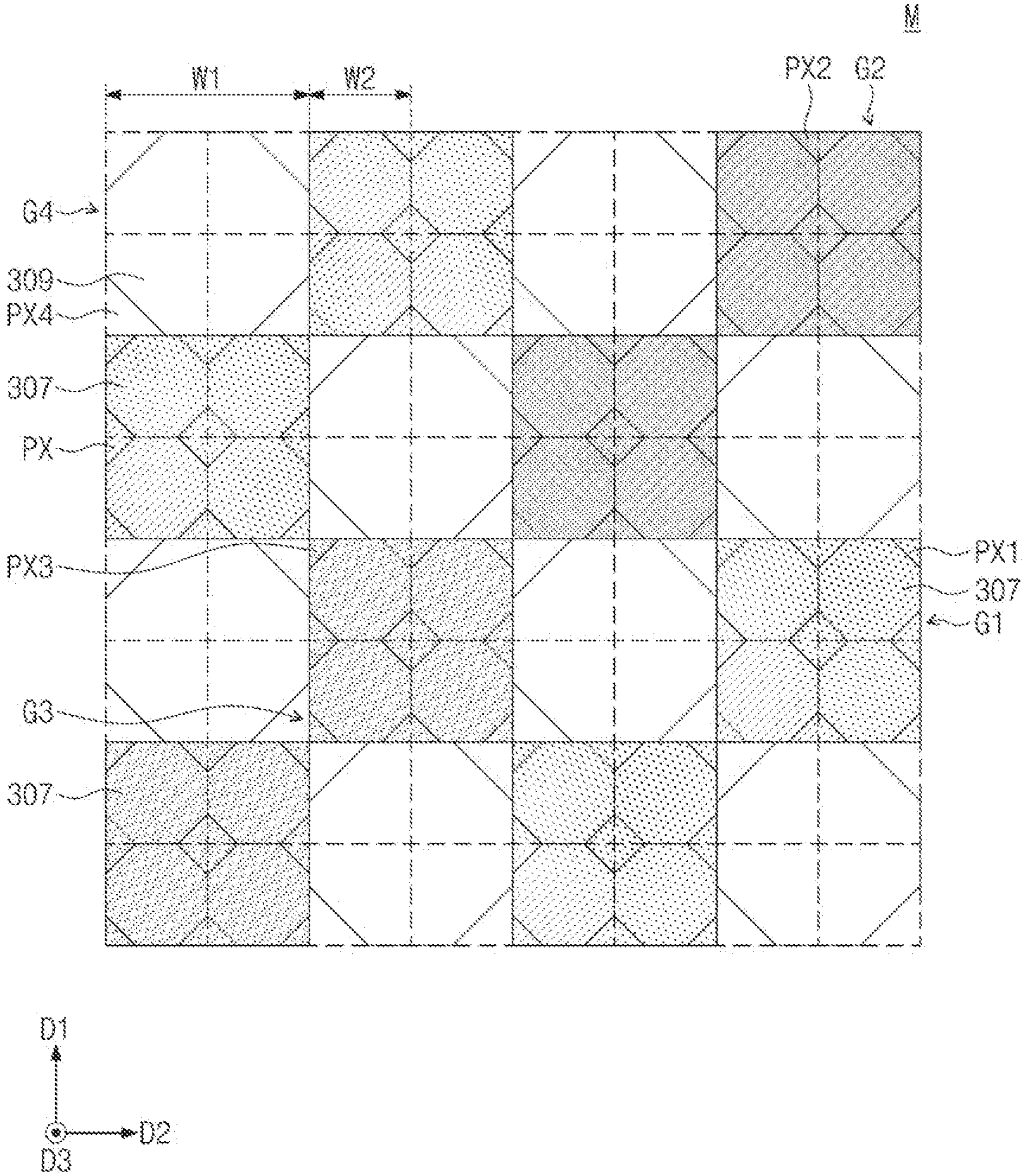
FIG. 8 illustrates an enlarged plan view showing section M in FIG. 2.

FIG. 8 illustrates an enlarged plan view showing section M in FIG. 2. In the example embodiment that follows, a detailed description of features repetitive to those discussed above with reference to FIGS. 4, 5A, and 5B will be omitted, and a difference thereof will be discussed in detail.

Referring to FIG. 8, each of the first and second microlenses 307 and 309 may have an octagonal shape when viewed in a plan view. However, embodiments are not limited thereto, and each of the first and second microlenses 307 and 309 may have various planar shapes. For example, each of the first and second microlenses 307 and 309 may have a tetragonal shape, a hexagonal shape, a dodecagonal shape, or any other suitable shape.

Figure 9:
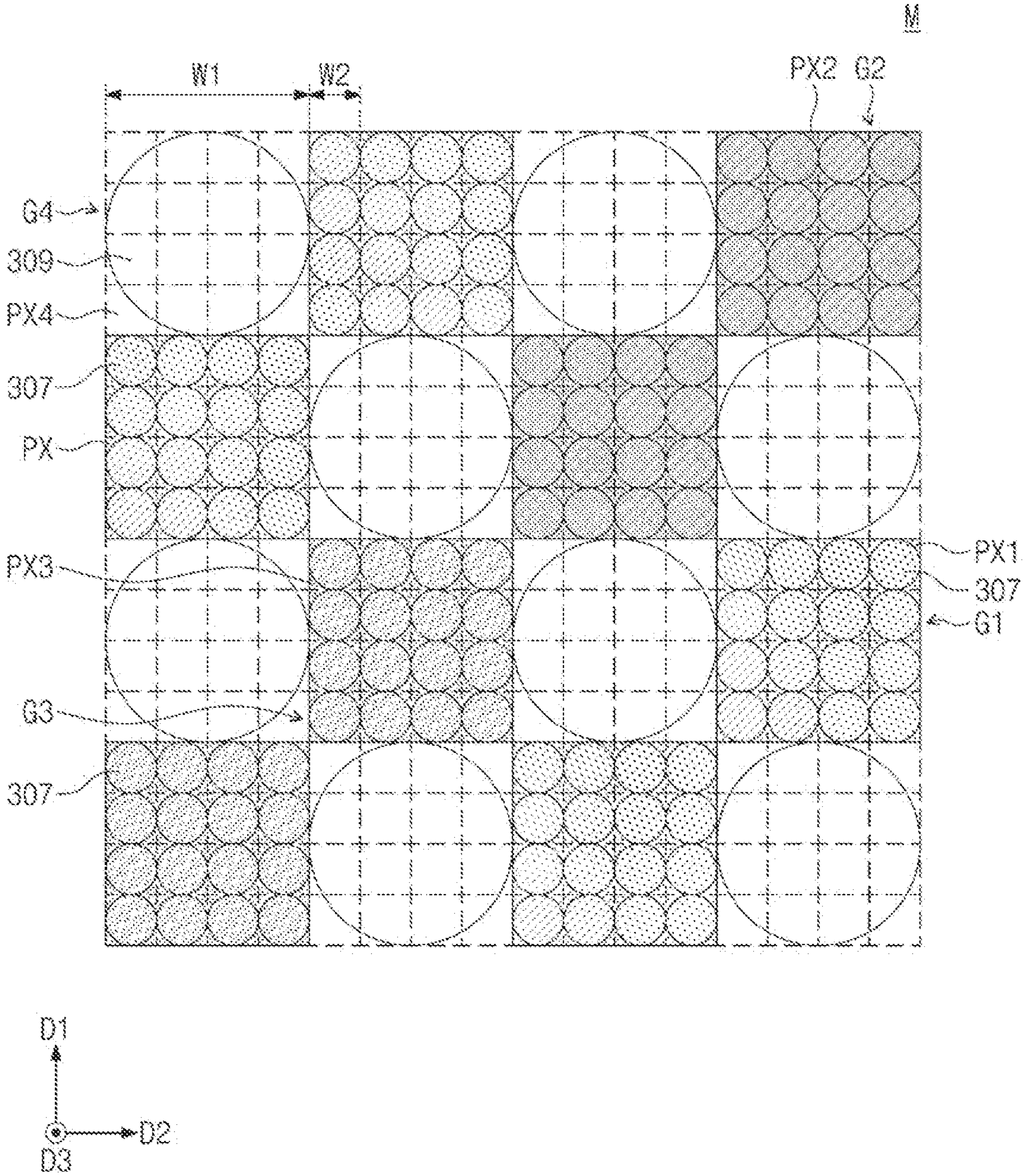
FIG. 9 illustrates an enlarged plan view showing section M of FIG. 2.

FIG. 9 illustrates an enlarged plan view showing section M of FIG. 2. In the example embodiment that follows, a detailed description of features repetitive to those discussed above with reference to FIGS. 4, 5A, and 5B will be omitted, and a difference thereof will be discussed in detail.

Referring to FIG. 9, each of the first, second, third, and fourth pixel domains G1, G2, G3, and G4 may have a 4×4 pixel structure. For example, each of the first, second, third, and fourth pixel domains G1, G2, G3, and G4 may include sixteen unit pixels PX. Sixteen first microlenses 307 may be located on each of the first, second, and third pixel domains G1, G2, and G3. One second microlens 309 may be provided on one fourth pixel domain G4.

The second microlens 309 may have a maximum width W2 greater than a maximum width W1 of the first microlens 307. The maximum width W2 of the second microlens 309 may be about four times the maximum width W1 of the first microlens 307.

Figure 10:
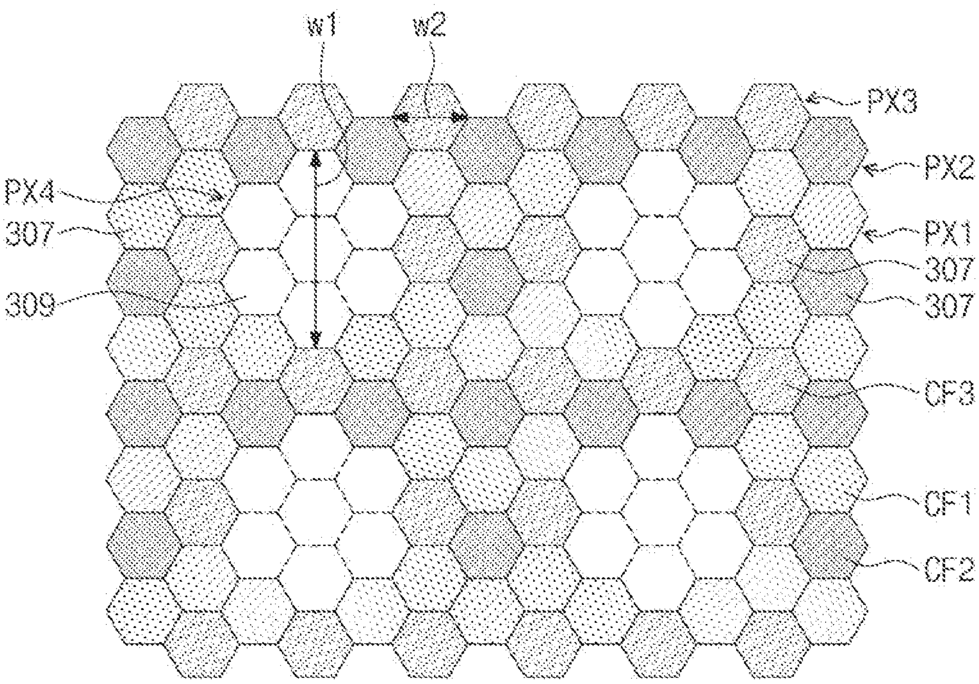
FIG. 10 illustrates a plan view showing an image sensor according to example embodiments.

FIG. 10 illustrates a plan view showing an image sensor according to example embodiments. In the example embodiment that follows, a detailed description of features repetitive to those discussed above with reference to FIGS. 4, 5A, and 5B will be omitted, and a difference thereof will be discussed in detail.

Referring to FIG. 10, each of the first, second, third, and fourth pixels PX1, PX2, PX3, and PX4 may have a hexagonal shape when viewed in plan. For example, the first, second, third, and fourth pixels PX1, PX2, PX3, and PX4 may constitute a honeycomb shape. The first color filter CF1, the second color filter CF2, and the third color filter CF3 may be provided on the first pixel PX1, the second pixel PX2, and the third pixel PX3, respectively. Each of the first, second, and third color filters CF1, CF2, and CF3 may have a hexagonal shape when viewed in a plan view. The first, second, and third color filters CF1, CF2, and CF3 may vertically overlap the first, second, and third pixels PX1, PX2, and PX3, respectively.

The first microlenses 307 may be correspondingly provided on the first pixels PX1, the second pixels PX2, and the third pixels PX3. Each of the first microlenses 307 may have a hexagonal shape when viewed in a plan view. For example, when viewed in a plan view, the first microlens 307 may have a shape substantially the same as a shape of a corresponding one of the first, second, and third pixels PX1, PX2, and PX3. The first microlens 307 may vertically overlap a corresponding one of the first, second, and third pixels PX1, PX2, and PX3. However, embodiments are not limited there to, and when viewed in a plan view, the first microlenses 307 may be closely fitted together with no empty space therebetween.

A plurality of fourth pixels PX4 may constitute a single pixel domain. For example, seven fourth pixels PX4 may constitute one pixel domain. The second microlens 309 may be disposed on the pixel domain. The second microlens 309 may vertically overlap the pixel domain. For example, when viewed in a plan view, the second microlens 309 may have a shape substantially the same as a shape of the pixel domain. According to another example embodiment, when viewed in a plan view, the first microlenses 307 and the second microlens 309 may be closely fitted together with no empty space between the second microlens 309 and the first microlenses 307. However, embodiments are not limited thereto, and the shape and arrangement of the first to fourth pixels PX1 to PX4, the first to third color filters CF1 to CF3, the first microlens 307, and the second microlens 309 may vary. For example, the first to fourth pixels PX1 to PX4, the first to third color filters CF1 to CF3, the first microlens 307, and the second microlens 309 may each have an octagonal shape or a dodecagonal shape when viewed in a plan view.

An image sensor according to an example embodiment may be configured such that a first microlens and a second microlens may have their uppermost parts located at substantially the same level. Accordingly, there may be a reduction in sensitivity difference between unit pixels, and accordingly it may be possible to reduce an increase in amount of data processed in the image sensor caused by correction of sensitivity difference. In addition, because the second microlens has a refractive index greater than a refractive index of the first microlens 307, crosstalk may be prevented or reduced between the unit pixels. As a result, the image sensor may improve in optical properties.

While examples embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:

a substrate comprising a plurality of first pixel domains and a plurality of second pixel domains, the first pixel domains and the second pixel domains being adjacent to each other in a first direction, each of the first pixel domains comprising first pixels and each of the second pixel domains comprising second pixels;

a first color filter provided on a first surface of the substrate and vertically overlapping the first pixels, the first pixels corresponding to a color of the first color filter;

first microlenses provided on the first color filter, the first microlenses respectively being provided on the first pixels included in each first pixel domain of the first pixel domains; and a second microlens provided on the first surface of the substrate and vertically overlapping at least a portion of each second pixel of the second pixels included in each second pixel domain of the second pixel domains, the second microlens being configured to operate as a white color filter, wherein the second microlens comprises:

a lens part having a curved top surface; and a flat part between the lens part and the first surface of the substrate, wherein the lens part and the flat part are integrally formed and comprise a same material, wherein a second refractive index of the second microlens is greater than a first refractive index of the first microlenses, wherein a level difference between an uppermost part of the first microlenses and an uppermost part of the second microlens is within about 2% of a maximum height of the first microlenses, wherein a first surface of the flat part of the second microlens facing the first surface of the substrate is coplanar with a first surface of the first color filter facing the first surface of the substrate, and wherein the first pixel domains and the second pixel domains are alternately disposed in each row of domains in the first direction and in each column of domains in a second direction intersecting the first direction.

2. The image sensor of claim 1, wherein a difference between the first refractive index of the first microlenses and the second refractive index of the second microlens is in a range of about 0.30 to about 0.45.

3. The image sensor of claim 1, wherein the maximum height of the first microlenses is substantially equal to a maximum height of the lens part of the second microlens.

4. The image sensor of claim 1, wherein a second curvature of the second microlens is different from a first curvature of the first microlenses.

5. The image sensor of claim 1, wherein the first color filter comprises a plurality of first color filters spaced apart from each other with the second pixel domains interposed therebetween, and wherein the first color filters have colors different from each other.

6. The image sensor of claim 1, wherein the first pixels included in the first pixel domains and the second pixels included in the second pixel domains are provided in a 2×2 structure, respectively.

7. The image sensor of claim 1, wherein the first pixels included in the first pixel domains and the second pixels included in the second pixel domains are provided in a 4×4 structure, respectively.

8. The image sensor of claim 1, wherein, when viewed in a plan view, each of the first microlenses and the second microlens has a hexagonal shape or an octagonal shape.

9. An image sensor comprising:

a substrate comprising a plurality of first pixel domains and a plurality of second pixel domains, the first pixel domains and the second pixel domains being adjacent to each other in a first direction, the substrate having a first surface and a second surface that are opposite to each other, each of the first pixel domains comprising first pixels, and each of the second pixel domains comprising second pixels;

a first color filter provided on the first surface of the substrate and vertically overlapping the first pixel domains, the first pixels corresponding to a color of the first color filter;

first microlenses provided on the first color filter, the first microlenses respectively being provided on the first pixels included in each first pixel domain of the first pixel domains; and a second microlens provided on the first surface of the substrate and vertically overlapping at least a portion of each second pixel of the second pixels included in each second pixel domain of the second pixel domains, the second microlens being configured to operate as a white color filter, wherein a second width of the second microlens is greater than a first width of each of the first microlenses, and a second refractive index of the second microlens is greater than a first refractive index of each of the first microlenses, wherein the second microlens comprises:

a lens part having a curved surface; and a flat part between the lens part and the first surface of the substrate, wherein the lens part and the flat part are integrally formed and comprise a same material, wherein a first surface of the flat part facing the first surface of the substrate is substantially coplanar with a first surface of the first color filter facing the first surface of the substrate, and wherein the first pixel domains and the second pixel domains are alternately disposed in each row of domains in the first direction and in each column of domains in a second direction intersecting the first direction.

10. The image sensor of claim 9, wherein a level difference between an uppermost part of each of the first microlenses and an uppermost part of the second microlens is within about 2% of a maximum height of each of the first microlenses.

11. The image sensor of claim 9, wherein a difference between the first refractive index of each of the first microlenses and the second refractive index of the second microlens is in a range of about 0.30 to about 0.45.

12. The image sensor of claim 9, further comprising:

a pixel separation pattern in the substrate, the pixel separation pattern separating the first pixels and the second pixels; and a light-shield pattern on the first surface of the substrate, wherein the light-shield pattern is on the pixel separation pattern between the first pixels of the first pixel domains and is not on the pixel separation pattern between the second pixels of the second pixel domains.

13. The image sensor of claim 9, wherein the first color filter comprises a plurality of first color filters spaced apart from each other with the second pixel domains interposed therebetween, and wherein the first color filters have colors different from each other.

14. An image sensor comprising:

a substrate having a first surface and a second surface that are opposite to each other, the substrate comprising a plurality of first pixel domains and a plurality of second pixel domains, the first pixel domains and the second pixel domains being adjacent to each other in a first direction, each of the first pixel domains comprising first pixels and each of the second pixel domains comprising second pixels;

a pixel separation pattern provided in the substrate and separating the first pixels and the second pixels;

a photoelectric conversion region in each of the first pixel domains and the second pixel domains;

an impurity region and a floating diffusion region that are in each of the first pixel domains and the second pixel domains, and are adjacent to the first surface of the substrate;

a device isolation pattern provided on one side of one of the impurity region and the floating diffusion region, the pixel separation pattern penetrating the device isolation pattern;

a gate electrode provided on the first surface of the substrate;

a gate dielectric pattern provided between the gate electrode and the substrate;

a gate spacer provided on a sidewall of the gate electrode;

a wiring layer provided on the second surface of the substrate, the wiring layer comprising a dielectric layer and wiring lines in the dielectric layer;

a backside dielectric layer on the second surface of the substrate;

a first color filter provided on the backside dielectric layer and vertically overlapping the first pixel domains, the first pixels corresponding to a color of the first color filter;

first microlenses provided on the first color filter, the first microlenses respectively being on the first pixels included in each first pixel domain of the first pixel domains;

a second microlens provided on the backside dielectric layer and vertically overlapping at least a portion of each second pixel of the second pixels included in each second pixel domain of the second pixel domains, the second microlens being configured to operate as a white color filter, wherein the second microlens comprises:

a lens part having a curved top surface; and a flat part between the lens part and the first surface of the substrate, wherein the lens part and the flat part are integrally formed and comprise a same material, wherein a second refractive index of the second microlens is greater than a first refractive index of the first microlenses, wherein a level difference between an uppermost part of the first microlenses and an uppermost part of the second microlens is within about 2% of a maximum height of the first microlenses, wherein a first surface of the second microlens facing the first surface of the substrate is coplanar with a first surface of the first color filter facing the first surface of the substrate, and wherein the first pixel domains and the second pixel domains are alternately disposed in each row of domains in the first direction and in each column of domains in a second direction intersecting the first direction.

15. The image sensor of claim 14, wherein the first color filter comprises a plurality of first color filters spaced apart from each other with the second pixel domains interposed therebetween, and wherein the first color filters have colors different from each other.

16. The image sensor of claim 14, wherein a width of the pixel separation pattern increases in a direction from the first surface of the substrate toward the second surface of the substrate.

17. The image sensor of claim 14, wherein a second width of the second microlens is greater than a first width of the first microlenses.

* * * * *